US012442897B1

(12) United States Patent
Wang

(10) Patent No.: US 12,442,897 B1
(45) Date of Patent: Oct. 14, 2025

(54) LIDAR SYSTEM AND MANUFACTURING METHOD HAVING SEMICONDUCTOR-BASED OPTICAL COMPONENTS COUPLED TOGETHER WITH SOLDER

(71) Applicant: Aurora Operations, Inc., Pittsburgh, PA (US)

(72) Inventor: Lei Wang, Fremont, CA (US)

(73) Assignee: AURORA OPERATIONS, INC., Pittsburgh, PA (US)

( * ) Notice: Subject to any disclaimer, the term of this patent is extended or adjusted under 35 U.S.C. 154(b) by 0 days.

(21) Appl. No.: 18/962,722

(22) Filed: Nov. 27, 2024

(51) Int. Cl.
*G01S 7/481* (2006.01)
*H05K 1/02* (2006.01)

(52) U.S. Cl.
CPC .......... *G01S 7/4811* (2013.01); *H05K 1/0203* (2013.01); *H05K 1/0274* (2013.01); *H05K 2201/10121* (2013.01); *H05K 2201/10378* (2013.01)

(58) Field of Classification Search
CPC .......... G01S 7/48; G01S 7/481; G01S 7/4811; G01S 7/4813; G01S 7/484; G01S 7/486; H05K 1/0201; H05K 1/0203; H05K 1/0274; H05K 1/0266; H05K 1/0269; H05K 2201/10007; H05K 2201/10121; H05K 2201/10227; H05K 2201/10378; G02B 6/24; G02B 6/42; G02B 6/4201; G02B 6/4202; G02B 6/4203; G02B 6/4249; G02B 6/4238
See application file for complete search history.

(56) References Cited

U.S. PATENT DOCUMENTS

| 5,023,881 | A | * | 6/1991 | Ackerman | ........... | G02B 6/4232 |
| | | | | | | 372/46.01 |
| 2017/0003463 | A1 | * | 1/2017 | Nadeau | ................. | H01S 5/0237 |
| 2023/0258884 | A1 | * | 8/2023 | Venkatesan | .......... | G02B 6/4245 |
| | | | | | | 438/26 |

FOREIGN PATENT DOCUMENTS

WO    WO-2022006345 A1 * 1/2022 ............. G01S 17/02

OTHER PUBLICATIONS

Lei Wang, U.S. Appl. No. 18/962,692, filed Nov. 27, 2024, LIDAR System Having Optical Components Coupled Together with Solder.

* cited by examiner

*Primary Examiner* — John P. Dulka
(74) *Attorney, Agent, or Firm* — Dority & Manning, P.A.

(57) ABSTRACT

A method for manufacturing a semiconductor-based light detection and ranging (LIDAR) system for a vehicle, includes: coupling a first optical component with solder disposed on a first portion of the first optical component to a second optical component in a first alignment operation, where the solder disposed on the first portion of the first optical component is not in contact with the second optical component and coupling the first optical component to a third optical component with solder disposed on a first portion of the third optical component in a second alignment operation, where the solder disposed on the first portion of the third optical component is not in contact with a second portion of the first optical component. Heat is then applied to the solder disposed on the first portion of the first optical component and the solder disposed on the first portion of the third optical component.

20 Claims, 21 Drawing Sheets

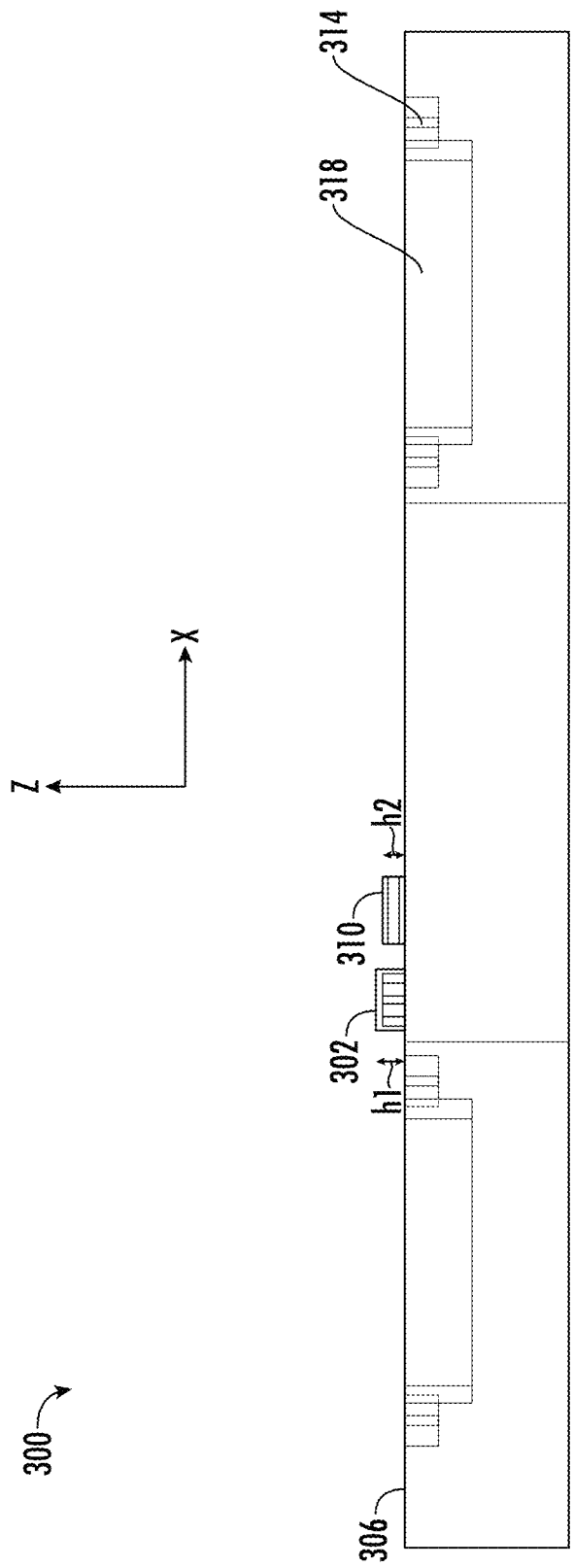

9100

9102
COUPLING A FIRST OPTICAL COMPONENT WITH SOLDER DISPOSED ON A FIRST PORTION OF THE FIRST OPTICAL COMPONENT TO A SECOND OPTICAL COMPONENT IN A FIRST ALIGNMENT OPERATION, WHEREIN AFTER THE FIRST OPTICAL COMPONENT IS COUPLED TO THE SECOND OPTICAL COMPONENT, THE SOLDER DISPOSED ON THE FIRST PORTION OF THE FIRST OPTICAL COMPONENT IS NOT IN CONTACT WITH THE SECOND OPTICAL COMPONENT

9104
APPLYING HEAT TO THE SOLDER DISPOSED ON THE FIRST PORTION OF THE FIRST OPTICAL COMPONENT TO CAUSE THE SOLDER DISPOSED ON THE FIRST PORTION OF THE FIRST OPTICAL COMPONENT TO FLOW TOWARD THE SECOND OPTICAL COMPONENT AND TO COME INTO CONTACT WITH THE SECOND OPTICAL COMPONENT

9106
COUPLING THE FIRST OPTICAL COMPONENT TO A THIRD OPTICAL COMPONENT WITH SOLDER DISPOSED ON A FIRST PORTION OF THE THIRD OPTICAL COMPONENT IN A SECOND ALIGNMENT OPERATION, WHEREIN AFTER THE FIRST OPTICAL COMPONENT IS COUPLED TO THE THIRD OPTICAL COMPONENT, THE SOLDER DISPOSED ON THE FIRST PORTION OF THE THIRD OPTICAL COMPONENT IS NOT IN CONTACT WITH A SECOND PORTION OF THE FIRST OPTICAL COMPONENT

9108
APPLYING HEAT TO THE SOLDER DISPOSED ON THE FIRST PORTION OF THE THIRD OPTICAL COMPONENT TO CAUSE THE SOLDER DISPOSED ON THE FIRST PORTION OF THE THIRD OPTICAL COMPONENT TO FLOW TOWARD THE FIRST OPTICAL COMPONENT AND TO COME INTO CONTACT WITH THE SECOND PORTION OF THE FIRST OPTICAL COMPONENT

FIG. 9

LIDAR SYSTEM AND MANUFACTURING METHOD HAVING SEMICONDUCTOR-BASED OPTICAL COMPONENTS COUPLED TOGETHER WITH SOLDER

CROSS-REFERENCE TO RELATED APPLICATIONS

This application is related to the following U.S. application which is filed concurrently herewith and is incorporated by reference herein in its entirety for all purposes: U.S. patent application Ser. No. 18/962,692 filed on Nov. 27, 2024.

BACKGROUND

Light Detection and Ranging (LIDAR) systems use lasers to create three-dimensional representations of surrounding environments. A LIDAR system includes at least one emitter paired with a receiver to form a channel, though an array of channels may be used to expand the field of view of the LIDAR system. During operation, each channel emits a laser beam into the environment. The laser beam reflects off of an object within the surrounding environment, and the reflected laser beam is detected by the receiver. A single channel provides a single point of ranging information. Collectively, channels are combined to create a point cloud that corresponds to a three-dimensional representation of the surrounding environment.

The emitter and/or receiver often includes photonic circuitry formed on a semiconductor substrate such as a silicon die. Silicon photonics dies can provide for precise formation of the photonic circuitry through, for example, photolithography. Other optical components of a LIDAR system may also be formed on semiconductor substrates, while still others are formed on or connected to components made using other semiconductor materials such as, for example, a group III-V semiconductor, gallium arsenide (GaAs), and/or other suitable materials.

SUMMARY

Aspects and advantages of implementations of the disclosure will be set forth in part in the following description, or may be learned from the description, or may be learned through practice of the implementations.

Examples of the disclosure also relate to a LIDAR system including a plurality of optical components which are coupled together using solder. Examples of the disclosure also relate to a method of manufacturing a LIDAR system (e.g., a semiconductor optical system for a semiconductor-based LIDAR system for a vehicle), the semiconductor optical system (e.g., a semiconductor optical assembly, a photonics module, etc.) having the optical components which are coupled together using solder.

To achieve the integration of many optics and photonic components into small form factor modules or systems, for example, an integrated LIDAR module, multiple semiconductor chips (silicon photonic chips, III-V chips, etc.) may be coupled directly together (e.g., butt-coupled or edge-coupled). For example, in optical and optoelectronic packaging, direct optical butt-coupling (also referred to as edge-coupling) may be used to couple a first waveguide to a second waveguide by providing (depositing) solder onto a surface of a first optical component and heating the solder to bond the first optical component to a second optical component. An alignment accuracy requirement (specification) may be satisfied according to examples of the disclosure.

The integration of laser diodes (LD) and/or semiconductor optical amplifier (SOA) chips with silicon photonics integrated circuit (Si PIC) chips can be achieved with flip-chip bonding, resulting in sub-micron in-plane alignment accuracy that can be necessary for optical coupling between waveguides on various chips. However, the out-of-plane alignment between Si PIC chips and LD/SOA chips can be difficult to achieve without active alignment, and without maintaining a bonding of the components with an adhesive (e.g., an organic adhesive such as epoxy bonding). Other challenges include heat dissipation for high power LD and/or SOA arrays and thermal interference to temperature sensitive devices in the Si PIC. Accordingly, optical components in a LIDAR system may not be sufficiently bonded together, and alignment issues (e.g., alignment accuracy) between the optical components may be encountered.

According to example embodiments of the disclosure, a LIDAR system includes a plurality of optical components including a first optical component, a second optical component, and a third optical component. In some implementations, the first optical component can be coupled to the third optical component via application of solder to the first optical component and the first optical component can be coupled to the second optical component via application of solder to the second optical component. The disclosure further relates to a method of manufacturing a LIDAR system (e.g., a semiconductor optical system for a semiconductor-based LIDAR system for a vehicle), the semiconductor optical system (e.g., a semiconductor optical assembly, a photonics module, etc.) having the optical components which are coupled together via application of solder to one or more of the optical components.

According to example embodiments of the disclosure, submicron out-of-plane alignment accuracy and effective heat dissipation for high power LD and/or SOA arrays can be achieved without requiring active alignment or by reducing the need for active alignment operations.

In some implementations, a LIDAR system includes a first optical component, a second optical component, and a third optical component (e.g., semiconductor optoelectronic and photonic chips) which are coupled together by applying solder in a particular manner while obtaining a three-dimensional alignment accuracy in the sub-micrometer range. For example, a method of assembling a first optical component (e.g., a silicon interposer chip), a second optical component (e.g., a semiconductor optical amplifier chip), and a third optical component (e.g., a silicon photonics integrated circuit chip), includes depositing solder on a first portion of the first optical component and implementing a flip chip operation to couple the first optical component to the second optical component in a first alignment operation. After the first optical component is coupled to the second optical component via the flip chip operation, the solder on the first portion of the first optical component is not in contact with the second optical component. In other words, the solder is spaced apart from the second optical component. The method further includes applying heat to the solder on the first optical component to cause the solder to flow toward the second optical component and to come into contact with the third optical component. The method further includes depositing solder on a first portion of the third optical component and coupling the third optical component to a second portion of the first optical component in a second alignment operation. After the third optical component is coupled to the first optical component, the solder on the first portion of the third optical component is not in contact with the first optical component. In other words, the solder is spaced apart from the first optical component. The method further includes applying heat to the solder on the third optical component to cause the solder to flow toward the first optical component and to come into contact with the first optical component.

For example, heat can be applied to the solder deposited on the first optical component by locally or globally heating the first optical component. For example, heat can be applied to the solder deposited on the second optical component by locally or globally heating the second optical component. For example, to locally heat the first optical component (or second optical component), heat is applied or directed to solder deposited on one or more under bump metal pads. In some implementations, separate heaters (e.g., resistive heaters) may be provided or positioned at or near each location of the under bump metal pads having solder deposited thereon. In some implementations a light source (e.g., a laser having a particular wavelength) may be provided or positioned at or near a location of an under bump metal pad having solder deposited thereon and the light source may be implemented (activated) to heat the solder. For example, to globally heat the first optical component (or second optical component), heat can be applied or directed to the entire first optical component (or second optical component) such that the entire first optical component (or second optical component) is heated.

In some implementations, the first alignment operation includes aligning the first optical component with the second optical component by reference to fiducial marks (e.g., etched fiducial marks) that are disposed on mating surfaces of the first optical component and the second optical component, for in-plane alignment. In some implementations, the second alignment operation includes aligning the first optical component with the third optical component by reference to fiducial marks (e.g., etched fiducial marks) that are disposed on mating surfaces of the first optical component and the third optical component, for in-plane alignment.

In some implementations, the first alignment operation includes aligning the first optical component with the second optical component using mechanical stops (e.g., pedestals) that are disposed on the first optical component, for out-of-plane alignment. The mechanical stops can be disposed adjacent to the first portion of the first optical component where the solder is applied to the first portion of the first optical component. The first portion of the first optical component can include an under bump metal pad provided on a surface of a dielectric material (e.g., silicon dioxide). When the solder is applied to the first portion of the first optical component, the solder is oversized compared to the first portion (the under bump metal pad). For example, the solder has a greater dimension (e.g., an area, perimeter, or diameter) than the first portion. When the heat is applied to the solder so as to bond the first optical component and second optical component, the solder can shrink its footprint and expand in height (e.g., in a direction toward the second optical component). For example, the solder can have the same, or substantially same dimension (e.g., an area, perimeter, or diameter), as the first portion. Further, after the solder flows toward and expands in the direction toward the second optical component, the solder can have the same height, or substantially same height, as the mechanical stop.

In some implementations, one or more heat spreaders may be coupled to one or more sides of the second optical component (e.g., the semiconductor optical amplifier chip). For example, the one or more heat spreaders may be formed by a plated metal film, such as a film including gold, a gold alloy, and/or other suitable conductive metal. The first optical component (e.g., the silicon interposer chip) can include a through-hole in which at least one heat spreader and the third optical component can be inserted. The second optical component having the one or more heat spreaders coupled thereto can be bonded to the first optical component via the solder and be supported by the mechanical stops, with optical facets of the second and third optical components facing each other such that waveguides of the second optical component are aligned with waveguides of the third optical component. Therefore, the disclosed optical system for a LIDAR system and method for manufacturing the same can be implemented for coupling optical components together while achieving submicron out-of-plane alignment accuracy and effective heat dissipation for high power semiconductor optical amplifier arrays.

In some implementations, the second optical component having the one or more heat spreaders coupled thereto and which is bonded to the first optical component via solder, and the third optical component which is also bonded to the first optical component via solder, can further be coupled to a carrier (e.g., via an adhesive such as glue). For example, the carrier can be connected electrically and thermally to one of the heat spreaders (e.g., through chip vias filled with metal for electrical conductivity) such that the carrier serves as both a heat sink and an electrical terminal for the whole device.

In some implementations, the LIDAR system further includes a fourth optical component (e.g., a second silicon photonics integrated circuit chip). For example, the method can further include depositing solder on a first portion of the fourth optical component and coupling the fourth optical component to a third portion of the first optical component in a third alignment operation. After the fourth optical component is coupled to the first optical component, the solder on the first portion of the fourth optical component is not in contact with the first optical component. In other words, the solder is spaced apart from the first optical component. The method further includes applying heat to the solder on the fourth optical component to cause the solder to flow toward the first optical component and to come into contact with the first optical component.

In some implementations, the third alignment operation includes aligning the first optical component with the fourth optical component by reference to fiducial marks (e.g., etched fiducial marks) that are disposed on mating surfaces of the first optical component and the fourth optical component, for in-plane alignment.

The disclosed optical system and method can be implemented to ensure that the optical components are securely and accurately coupled together, thereby improving the structural integrity of the optical components of the optical system. Further, according to the optical systems and methods described herein, an alignment of optical components can be improved compared to previous methods.

Examples of the disclosure are directed to LIDAR systems for autonomous vehicles. As further described herein, the LIDAR systems can be used by various devices and platforms (e.g., robotic platforms, etc.) to improve the ability of the devices and platforms to perceive their environment and perform functions in response thereto (e.g., autonomously navigating through the environment).

An autonomous vehicle (AV) can include a LIDAR system to assist the AV in perceiving its environment and navigating its environment. The LIDAR system can include a transceiver having a transmitter and receiver. The transmitter can condition a light beam (e.g., a laser beam) to be emitted by the LIDAR system into its environment. Similarly, the receiver can provide for receiving the light beam after it is emitted into the environment of the LIDAR system and reflected by objects in the environment. The receiver can provide the received beam to downstream components of the LIDAR system for processing, which can provide for the AV to perceive its environment. Because of the correlation between the transmitted beam and received beam, the transmitter and receiver may generally be placed in a tightly controlled positional relationship. For instance, the portion of the transmitter that emits the beam can be positioned near the portion of the receiver that receives the beam. In addition, some LIDAR systems such as coherent LIDAR systems can utilize a reference signal, such as a local oscillator (LO) signal, which passes from the transmitter to receiver without being emitted into the environment of the LIDAR system. For instance, this reference signal may be combined with the received beam to denoise or otherwise process the received beam to extract useful information. For instance, the LIDAR system can determine a distance to the object and/or velocity of the object based on the reflected beam.

The disclosure provides an improved LIDAR system, such as a coherent LIDAR system, which includes components which are properly aligned, coupled together, or positioned according to specification or tolerance requirements.

A coupling system and a LIDAR system according to the disclosure can provide numerous technical effects and benefits. For example, a coupling method implemented by a coupling system as described herein can ensure that semiconductor optical devices implemented in a LIDAR system operate (function) according to specifications and are positioned within a LIDAR system (e.g. LIDAR system) according to design or specification requirements.

For instance, the LIDAR systems manufactured according to the disclosure can provide improved accuracy of object detections through properly aligned or coupled components (e.g., properly aligned semiconductor optical devices). In addition, when a plurality of semiconductor optical devices are provided, the semiconductor optical devices can be coupled together with respect to one another according to the methods described herein, thereby improving the quality of the LIDAR system (e.g., LIDAR system). In this manner, LIDAR systems according to the disclosure can provide improved performance compared to some existing LIDAR systems.

Example aspects of the disclosure provide an example method for manufacturing a semiconductor-based light detection and ranging (LIDAR) system for a vehicle. The example method includes: coupling a first optical component with solder disposed on a first portion of the first optical component to a second optical component in a first alignment operation, wherein after the first optical component is coupled to the second optical component, the solder disposed on the first portion of the first optical component is not in contact with the second optical component; applying heat to the solder disposed on the first portion of the first optical component to cause the solder disposed on the first portion of the first optical component to flow toward the second optical component and to come into contact with the second optical component; coupling the first optical component to a third optical component with solder disposed on a first portion of the third optical component in a second alignment operation, wherein after the first optical component is coupled to the third optical component, the solder disposed on the first portion of the third optical component is not in contact with a second portion of the first optical component; and applying heat to the solder disposed on the first portion of the third optical component to cause the solder disposed on the first portion of the third optical component to flow toward the first optical component and to come into contact with the second portion of the first optical component.

In some implementations, the first portion of the first optical component is an under bump metal pad.

In some implementations, an area of the under bump metal pad is smaller than an area of the solder disposed on the first portion of the first optical component before the heat is applied to the solder disposed on the first portion of the first optical component.

In some implementations, the area of the under bump metal pad is substantially the same as the area of the solder disposed on the first portion of the first optical component after the heat is applied to the solder disposed on the first portion of the first optical component.

In some implementations, the first portion of the first optical component is disposed on an outer surface of the first optical component, and the second portion of the first optical component corresponds to a recess of the outer surface of the first optical component.

In some implementations, the first optical component includes a through-hole, and coupling the first optical component to the second optical component in the first alignment operation comprises inserting the second optical component in the through-hole.

In some implementations, the first alignment operation comprises aligning the first optical component with the second optical component using a first plurality of mechanical stops disposed on the first optical component and a plurality of fiducial marks disposed on the second optical component.

In some implementations, a first mechanical stop among the first plurality of mechanical stops is disposed adjacent to the first portion of the first optical component, a height of the first mechanical stop is greater than a height of the solder disposed on the first portion of the first optical component before the heat is applied to the solder disposed on the first portion of the first optical component, and the height of the first mechanical stop is substantially the same as the height of the solder disposed on the first portion of the first optical component after the heat is applied to the solder disposed on the first portion of the first optical component.

In some implementations, the first optical component includes a silicon interposer chip having a through-hole, the second optical component includes a semiconductor optical amplifier chip, and the third optical component includes a silicon photonics integrated circuit chip.

In some implementations, the method includes coupling a first heat spreader to a first side of the semiconductor optical amplifier chip, and wherein the first alignment operation comprises a flip chip operation comprising: flipping over the semiconductor optical amplifier chip having the first heat spreader coupled thereto, and coupling a second heat spreader to a second side of the semiconductor optical amplifier chip, and coupling the silicon interposer chip to the semiconductor optical amplifier chip in the first alignment operation by inserting the semiconductor optical amplifier chip having the first heat spreader and the second heat spreader coupled thereto, in the through-hole.

In some implementations, a surface area of a side of the first heat spreader facing the first side of the semiconductor optical amplifier chip is greater than a surface area of a side of the second heat spreader facing the second side of the semiconductor optical amplifier chip.

In some implementations, applying the heat to the solder disposed on the first portion of the first optical component comprises performing a first heating operation locally heating the first portion of the first optical component, and applying the heat to the solder disposed on the first portion of the third optical component comprises performing a second heating operation locally heating the first portion of the third optical component.

In some implementations, applying the heat to the solder disposed on the first portion of the first optical component and applying the heat to the solder disposed on the first portion of the third optical component comprises performing a global heating operation globally heating the first optical component and the third optical component at substantially a same time.

In some implementations, the method includes providing a fourth optical component with solder disposed on a first portion of the fourth optical component; coupling the first optical component to the fourth optical component in a third alignment operation, wherein after the first optical component is coupled to the fourth optical component, the solder disposed on the first portion of the fourth optical component is not in contact with a third portion of the first optical component; and applying heat to the solder disposed on the first portion of the fourth optical component to cause the solder disposed on the first portion of the fourth optical component to flow toward the first optical component and to come into contact with the third portion of the first optical component.

Example aspects of the disclosure provide a semiconductor-based light detection and ranging (LIDAR) system. The example LIDAR system includes: an optical system, comprising: a first optical component, including: solder disposed on each of one or more first portions of the first optical component, one or more second portions, and one or more mechanical stops disposed on each of one or more third portions of the first optical component, and a second optical component, including: one or more first portions respectively coupled to the each of the one or more first portions of the first optical component via the solder disposed on the each of the one or more first portions of the first optical component, and one or more second portions respectively supported by the one or more mechanical stops of the first optical component, and a third optical component, including: solder disposed on each of one or more first portions of the third optical component, each of the one or more second portions of the first optical component being respectively coupled to the each of the one or more first portions of the third optical component via the solder disposed on the each of the one or more first portions of the third optical component; and wherein an area of the solder disposed on at least one of the one or more first portions of the first optical component is substantially the same as an area of a corresponding first portion of the one or more first portions of the first optical component, and a height of the solder disposed on at least one of the one or more first portions of the first optical component is substantially the same as a height of at least one mechanical stop of the one or more mechanical stops extending in a direction toward the second optical component.

In some implementations, the one or more first portions are one or more under bump metal pads of the first optical component.

In some implementations, each first portion of the first optical component is disposed on an outer surface of the first optical component, and each second portion of the first optical component corresponds to a recess of the outer surface of the first optical component.

In some implementations, the first optical component includes a silicon interposer chip having a through-hole, the second optical component includes a semiconductor optical amplifier chip, and the third optical component includes a silicon photonics integrated circuit chip.

In some implementations, a first heat spreader coupled to a first side of the semiconductor optical amplifier chip; and a second heat spreader coupled to a second side of the semiconductor optical amplifier chip, wherein the second side of the semiconductor optical amplifier chip faces toward the silicon interposer chip and the first heat spreader is disposed outside of the through-hole.

In some implementations, the first optical component includes one or more third portions and one or more first waveguides, the second optical component includes one or more second waveguides aligned with the one or more first waveguides, and the optical system further comprises: a fourth optical component, including: solder disposed on each of one or more first portions of the fourth optical component, each of the one or more third portions of the first optical component being respectively coupled to the each of the one or more first portions of the fourth optical component via the solder disposed on the each of the one or more first portions of the fourth optical component, and one or more third waveguides aligned with the one or more first waveguides.

In some implementations, the third optical component is disposed on a first side of the second optical component, and the fourth optical component is disposed on a second side of the second optical component, the first side of the second optical component being opposite of the second side of the second optical component.

Example aspects of the disclosure provide an example autonomous vehicle (AV) control system for a vehicle. The example AV control system for the vehicle includes one or more processors and the example LIDAR sensor system described herein.

Example aspects of the disclosure provide an example autonomous vehicle (AV). The example AV includes: an autonomous vehicle control system, the autonomous vehicle control system comprising one or more processors and a Light Detection and Ranging (LIDAR) system, the LIDAR system comprising: a light source configured to emit a beam to be directed toward an object in an environment of the autonomous vehicle; and an optical system, comprising: a first optical component, including: solder disposed on each of one or more first portions of the first optical component, one or more second portions, and one or more mechanical stops disposed on each of one or more third portions of the first optical component, and a second optical component, including: one or more first portions respectively coupled to the each of the one or more first portions of the first optical component via the solder disposed on the each of the one or more first portions of the first optical component, and one or more second portions respectively supported by the one or more mechanical stops of the first optical component, a third optical component, including: solder disposed on each of one or more first portions of the third optical component, each of the one or more second portions of the first optical component being respectively coupled to the each of the one or more first portions of the third optical component via the solder disposed on the each of the one or more first portions of the third optical component; and wherein an area of the solder disposed on at least one of the one or more first portions of the first optical component is substantially the same as an area of a corresponding first portion of the one or more first portions of the first optical component, and a height of the solder disposed on at least one of the one or more first portions of the first optical component is substantially the same as a height of at least one mechanical stop of the one or more mechanical stops extending in a direction toward the second optical component a receiver configured to receive a reflected beam from the object and determine an object detection associated with the object by processing the reflected beam via at least one of the second optical element or the third optical element; and an autonomous vehicle controller configured to control the autonomous vehicle based on the object detection associated with the object.

Other aspects of the disclosure are directed to other systems, methods, vehicles, apparatuses, tangible non-transitory computer-readable media, and devices for motion prediction and/or operation of a device including a LIDAR system having a LIDAR module according to aspects of the disclosure.

These and other features, aspects and advantages of various implementations of the disclosure will become better understood with reference to the following description and appended claims. The accompanying drawings, which are incorporated in and constitute a part of this specification, illustrate implementations of the disclosure and, together with the description, serve to explain the related principles.

BRIEF DESCRIPTION OF THE DRAWINGS

FIGS. 3A-3C are views of an example first optical component for an example optical system for a LIDAR system, according to some implementations of the disclosure.

FIGS. 9-10 illustrate flow diagrams of example, non-limiting computer-implemented methods, according to one or more example embodiments of the disclosure.

DETAILED DESCRIPTION

The following describes the technology of this disclosure within the context of a LIDAR system and an autonomous vehicle for example purposes only. As described herein, the technology is not limited to an autonomous vehicle and can be implemented within other robotic and computing systems as well as various devices. For example, the systems and methods disclosed herein can be implemented in a variety of ways including, but not limited to, a computer-implemented method, an autonomous vehicle system, an autonomous vehicle control system, a robotic platform system, a general robotic device control system, a computing device, etc.

Figure 1:
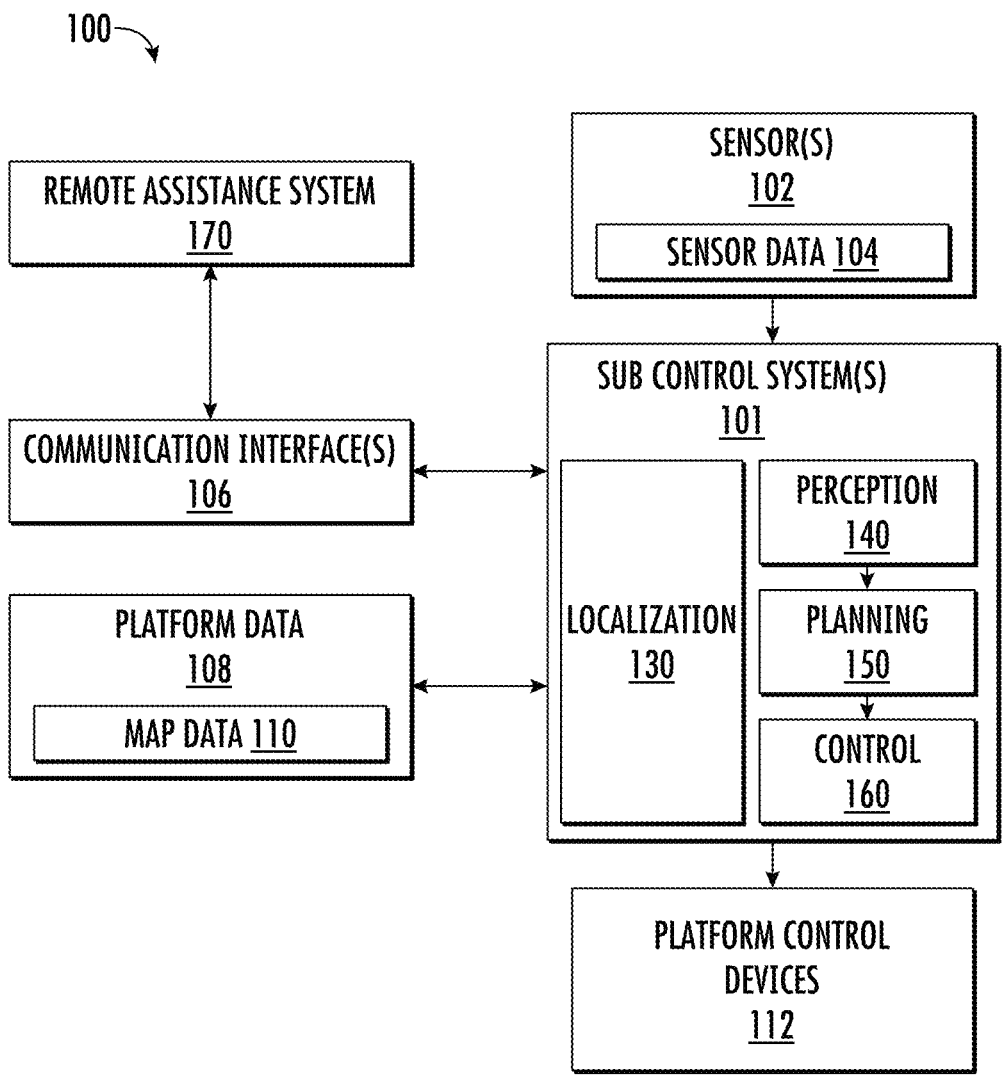
FIG. 1 depicts a block diagram of an example system according to some implementations of the disclosure.

With reference to FIGS. 1-10, example implementations of the disclosure are discussed in further detail. FIG. 1 depicts a block diagram of an autonomous vehicle control system 100 for an autonomous vehicle according to some implementations of the disclosure. The autonomous vehicle control system 100 can be implemented by a computing system of an autonomous vehicle). The autonomous vehicle control system 100 can include one or more sub-control systems 101 that operate to obtain inputs from sensor(s) 102 or other input devices of the autonomous vehicle control system 100. In some implementations, the sub-control system(s) 101 can additionally obtain platform data 108 (e.g., map data 110) from local or remote storage. The sub-control system(s) 101 can generate control outputs for controlling the autonomous vehicle (e.g., through platform control devices 112, etc.) based on sensor data 104, map data 110, or other data. The sub-control system 101 may include different subsystems for performing various autonomy operations. The subsystems may include a localization system 130, a perception system 140, a planning system 150, and a control system 160. The localization system 130 can determine the location of the autonomous vehicle within its environment; the perception system 140 can detect, classify, and track objects and actors in the environment; the planning system 150 can determine a trajectory for the autonomous vehicle; and the control system 160 can translate the trajectory into vehicle controls for controlling the autonomous vehicle. The sub-control system(s) 101 can be implemented by one or more onboard computing system(s). The subsystems can include one or more processors and one or more memory devices. The one or more memory devices can store instructions executable by the one or more processors to cause the one or more processors to perform operations or functions associated with the subsystems. The computing resources of the sub-control system(s) 101 can be shared among its subsystems, or a subsystem can have a set of dedicated computing resources.

In some implementations, the autonomous vehicle control system 100 can be implemented for or by an autonomous vehicle (e.g., a ground-based autonomous vehicle). The autonomous vehicle control system 100 can perform various processing techniques on inputs (e.g., the sensor data 104, the map data 110) to perceive and understand the vehicle's surrounding environment and generate an appropriate set of control outputs to implement a vehicle motion plan (e.g., including one or more trajectories) for traversing the vehicle's surrounding environment. In some implementations, an autonomous vehicle implementing the autonomous vehicle control system 100 can drive, navigate, operate, etc. with minimal or no interaction from a human operator (e.g., driver, pilot, etc.).

In some implementations, the autonomous vehicle can be configured to operate in a plurality of operating modes. For instance, the autonomous vehicle can be configured to operate in a fully autonomous (e.g., self-driving, etc.) operating mode in which the autonomous platform is controllable without user input (e.g., can drive and navigate with no input from a human operator present in the autonomous vehicle or remote from the autonomous vehicle, etc.). The autonomous vehicle can operate in a semi-autonomous operating mode in which the autonomous vehicle can operate with some input from a human operator present in the autonomous vehicle (or a human operator that is remote from the autonomous platform). In some implementations, the autonomous vehicle can enter into a manual operating mode in which the autonomous vehicle is fully controllable by a human operator (e.g., human driver, etc.) and can be prohibited or disabled (e.g., temporary, permanently, etc.) from performing autonomous navigation (e.g., autonomous driving, etc.). The autonomous vehicle can be configured to operate in other modes such as, for example, park or sleep modes (e.g., for use between tasks such as waiting to provide a trip/service, recharging, etc.). In some implementations, the autonomous vehicle can implement vehicle operating assistance technology (e.g., collision mitigation system, power assist steering, etc.), for example, to help assist the human operator of the autonomous platform (e.g., while in a manual mode, etc.).

The autonomous vehicle control system 100 can be located onboard (e.g., on or within) an autonomous vehicle and can be configured to operate the autonomous vehicle in various environments. The environment may be a real-world environment or a simulated environment. In some implementations, one or more simulation computing devices can simulate one or more of: the sensors 102, the sensor data 104, communication interface(s) 106, the platform data 108, or the platform control devices 112 for simulating operation of the autonomous vehicle control system 100.

In some implementations, the sub-control system(s) 101 can communicate with one or more networks or other systems with communication interface(s) 106. The communication interface(s) 106 can include any suitable components for interfacing with one or more network(s), including, for example, transmitters, receivers, ports, controllers, antennas, or other suitable components that can help facilitate communication. In some implementations, the communication interface(s) 106 can include a plurality of components (e.g., antennas, transmitters, or receivers, etc.) that allow it to implement and utilize various communication techniques (e.g., multiple-input, multiple-output (MIMO) technology, etc.).

In some implementations, the sub-control system(s) 101 can use the communication interface(s) 106 to communicate with one or more computing devices that are remote from the autonomous vehicle over one or more network(s). For instance, in some examples, one or more inputs, data, or functionalities of the sub-control system(s) 101 can be supplemented or substituted by a remote system communicating over the communication interface(s) 106. For instance, in some implementations, the map data 110 can be downloaded over a network to a remote system using the communication interface(s) 106. In some examples, one or more of the localization system 130, the perception system 140, the planning system 150, or the control system 160 can be updated, influenced, nudged, communicated with, etc. by a remote system for assistance, maintenance, situational response override, management, etc.

The sensor(s) 102 can be located onboard the autonomous platform. In some implementations, the sensor(s) 102 can include one or more types of sensor(s). For instance, one or more sensors can include image capturing device(s) (e.g., visible spectrum cameras, infrared cameras, etc.). Additionally, or alternatively, the sensor(s) 102 can include one or more depth capturing device(s). For example, the sensor(s) 102 can include one or more LIDAR sensor(s) or Radio Detection and Ranging (RADAR) sensor(s). The sensor(s) 102 can be configured to generate point data descriptive of at least a portion of a three-hundred-and-sixty-degree view of the surrounding environment. The point data can be point cloud data (e.g., three-dimensional LIDAR point cloud data, RADAR point cloud data). In some implementations, one or more of the sensor(s) 102 for capturing depth information can be fixed to a rotational device in order to rotate the sensor(s) 102 about an axis. The sensor(s) 102 can be rotated about the axis while capturing data in interval sector packets descriptive of different portions of a three-hundred-and-sixty-degree view of a surrounding environment of the autonomous platform. In some implementations, one or more of the sensor(s) 102 for capturing depth information can be solid state.

The sensor(s) 102 can be configured to capture the sensor data 104 indicating or otherwise being associated with at least a portion of the environment of the autonomous vehicle. The sensor data 104 can include image data (e.g., 2D camera data, video data, etc.), RADAR data, LIDAR data (e.g., 3D point cloud data, etc.), audio data, or other types of data. In some implementations, the sub-control system(s) 101 can obtain input from additional types of sensors, such as inertial measurement units (IMUs), altimeters, inclinometers, odometry devices, location or positioning devices (e.g., GPS, compass), wheel encoders, or other types of sensors. In some implementations, the sub-control system(s) 101 can obtain sensor data 104 associated with particular component(s) or system(s) of the autonomous vehicle. This sensor data 104 can indicate, for example, wheel speed, component temperatures, steering angle, cargo or passenger status, etc. In some implementations, the sub-control system(s) 101 can obtain sensor data 104 associated with ambient conditions, such as environmental or weather conditions. In some implementations, the sensor data 104 can include multi-modal sensor data. The multi-modal sensor data can be obtained by at least two different types of sensor(s) (e.g., of the sensors 102) and can indicate static and/or dynamic object(s) or actor(s) within an environment of the autonomous vehicle. The multi-modal sensor data can include at least two types of sensor data (e.g., camera and LIDAR data). In some implementations, the autonomous vehicle can utilize the sensor data 104 for sensors that are remote from (e.g., offboard) the autonomous vehicle. This can include for example, sensor data 104 captured by a different autonomous vehicle.

The sub-control system(s) 101 can obtain the map data 110 associated with an environment in which the autonomous vehicle was, is, or will be located. The map data 110 can provide information about an environment or a geographic area. For example, the map data 110 can provide information regarding the identity and location of different travel ways (e.g., roadways, etc.), travel way segments (e.g., road segments, etc.), buildings, or other items or objects (e.g., lampposts, crosswalks, curbs, etc.); the location and directions of boundaries or boundary markings (e.g., the location and direction of traffic lanes, parking lanes, turning lanes, bicycle lanes, other lanes, etc.); traffic control data (e.g., the location and instructions of signage, traffic lights, other traffic control devices, etc.); obstruction information (e.g., temporary or permanent blockages, etc.); event data (e.g., road closures/traffic rule alterations due to parades, concerts, sporting events, etc.); nominal vehicle path data (e.g., indicating an ideal vehicle path such as along the center of a certain lane, etc.); or any other map data that provides information that assists an autonomous vehicle in understanding its surrounding environment and its relationship thereto. In some implementations, the map data 110 can include high-definition map information. Additionally, or alternatively, the map data 110 can include sparse map data (e.g., lane graphs, etc.). In some implementations, the sensor data 104 can be fused with or used to update the map data 110 in real time.

The sub-control system(s) 101 can include the localization system 130, which can provide an autonomous vehicle with an understanding of its location and orientation in an environment. In some examples, the localization system 130 can support one or more other subsystems of the sub-control system(s) 101, such as by providing a unified local reference frame for performing, e.g., perception operations, planning operations, or control operations.

In some implementations, the localization system 130 can determine the current position of the autonomous vehicle. A current position can include a global position (e.g., respecting a georeferenced anchor, etc.) or relative position (e.g., respecting objects in the environment, etc.). The localization system 130 can generally include or interface with any device or circuitry for analyzing a position or change in position of an autonomous vehicle. For example, the localization system 130 can determine position by using one or more of: inertial sensors (e.g., inertial measurement unit(s), etc.), a satellite positioning system, radio receivers, networking devices (e.g., based on IP address, etc.), triangulation or proximity to network access points or other network components (e.g., cellular towers, Wi-Fi access points, etc.), or other suitable techniques. The position of the autonomous vehicle can be used by various subsystems of the sub-control system(s) 101 or provided to a remote computing system (e.g., using the communication interface(s) 106).

In some implementations, the localization system 130 can register relative positions of elements of a surrounding environment of the autonomous vehicle with recorded positions in the map data 110. For instance, the localization system 130 can process the sensor data 104 (e.g., LIDAR data, RADAR data, camera data, etc.) for aligning or otherwise registering to a map of the surrounding environment (e.g., from the map data 110) to understand the autonomous vehicle's position within that environment. Accordingly, in some implementations, the autonomous vehicle can identify its position within the surrounding environment (e.g., across six axes, etc.) based on a search over the map data 110. In some implementations, given an initial location, the localization system 130 can update the autonomous vehicle's location with incremental re-alignment based on recorded or estimated deviations from the initial location. In some implementations, a position can be registered directly within the map data 110.

In some implementations, the map data 110 can include a large volume of data subdivided into geographic tiles, such that a desired region of a map stored in the map data 110 can be reconstructed from one or more tiles. For instance, a plurality of tiles selected from the map data 110 can be stitched together by the sub-control system 101 based on a position obtained by the localization system 130 (e.g., a number of tiles selected in the vicinity of the position).

In some implementations, the localization system 130 can determine positions (e.g., relative or absolute) of one or more attachments or accessories for an autonomous vehicle. For instance, an autonomous vehicle can be associated with a cargo platform, and the localization system 130 can provide positions of one or more points on the cargo platform. For example, a cargo platform can include a trailer or other device towed or otherwise attached to or manipulated by an autonomous vehicle, and the localization system 130 can provide for data describing the position (e.g., absolute, relative, etc.) of the autonomous vehicle as well as the cargo platform. Such information can be obtained by the other autonomy systems to help operate the autonomous vehicle.

The sub-control system(s) 101 can include the perception system 140, which can allow an autonomous platform to detect, classify, and track objects and actors in its environment. Environmental features or objects perceived within an environment can be those within the field of view of the sensor(s) 102 or predicted to be occluded from the sensor(s) 102. This can include object(s) not in motion or not predicted to move (static objects) or object(s) in motion or predicted to be in motion (dynamic objects/actors).

The perception system 140 can determine one or more states (e.g., current or past state(s), etc.) of one or more objects that are within the surrounding environment of an autonomous vehicle. For example, state(s) can describe (e.g., for a given time, time period, etc.) an estimate of an object's current or past location (also referred to as position); current or past speed/velocity; current or past acceleration; current or past heading; current or past orientation; size/footprint (e.g., as represented by a bounding shape, object highlighting, etc.); classification (e.g., pedestrian class vs. vehicle class vs. bicycle class, etc.); the uncertainties associated therewith; or other state information. In some implementations, the perception system 140 can determine the state(s) using one or more algorithms or machine-learned models configured to identify/classify objects based on inputs from the sensor(s) 102. The perception system can use different modalities of the sensor data 104 to generate a representation of the environment to be processed by the one or more algorithms or machine-learned models. In some implementations, state(s) for one or more identified or unidentified objects can be maintained and updated over time as the autonomous vehicle continues to perceive or interact with the objects (e.g., maneuver with or around, yield to, etc.). In this manner, the perception system 140 can provide an understanding about a current state of an environment (e.g., including the objects therein, etc.) informed by a record of prior states of the environment (e.g., including movement histories for the objects therein). Such information can be helpful as the autonomous vehicle plans its motion through the environment.

The sub-control system(s) 101 can include the planning system 150, which can be configured to determine how the autonomous platform is to interact with and move within its environment. The planning system 150 can determine one or more motion plans for an autonomous platform. A motion plan can include one or more trajectories (e.g., motion trajectories) that indicate a path for an autonomous vehicle to follow. A trajectory can be of a certain length or time range. The length or time range can be defined by the computational planning horizon of the planning system 150. A motion trajectory can be defined by one or more waypoints (with associated coordinates). The waypoint(s) can be future location(s) for the autonomous platform. The motion plans can be continuously generated, updated, and considered by the planning system 150.

The planning system 150 can determine a strategy for the autonomous platform. A strategy may be a set of discrete decisions (e.g., yield to actor, reverse yield to actor, merge, lane change) that the autonomous platform makes. The strategy may be selected from a plurality of potential strategies. The selected strategy may be a lowest cost strategy as determined by one or more cost functions. The cost functions may, for example, evaluate the probability of a collision with another actor or object.

The planning system 150 can determine a desired trajectory for executing a strategy. For instance, the planning system 150 can obtain one or more trajectories for executing one or more strategies. The planning system 150 can evaluate trajectories or strategies (e.g., with scores, costs, rewards, constraints, etc.) and rank them. For instance, the planning system 150 can use forecasting output(s) that indicate interactions (e.g., proximity, intersections, etc.) between trajectories for the autonomous platform and one or more objects to inform the evaluation of candidate trajectories or strategies for the autonomous platform. In some implementations, the planning system 150 can utilize static cost(s) to evaluate trajectories for the autonomous platform (e.g., "avoid lane boundaries," "minimize jerk," etc.). Additionally, or alternatively, the planning system 150 can utilize dynamic cost(s) to evaluate the trajectories or strategies for the autonomous platform based on forecasted outcomes for the current operational scenario (e.g., forecasted trajectories or strategies leading to interactions between actors, forecasted trajectories or strategies leading to interactions between actors and the autonomous platform, etc.). The planning system 150 can rank trajectories based on one or more static costs, one or more dynamic costs, or a combination thereof. The planning system 150 can select a motion plan (and a corresponding trajectory) based on a ranking of a plurality of candidate trajectories. In some implementations, the planning system 150 can select the highest ranked candidate, or a highest ranked feasible candidate.

The planning system 150 can then validate the selected trajectory against one or more constraints before the trajectory is executed by the autonomous platform.

To help with its motion planning decisions, the planning system 150 can be configured to perform a forecasting function. The planning system 150 can forecast future state(s) of the environment. This can include forecasting the future state(s) of other actors in the environment. In some implementations, the planning system 150 can forecast future state(s) based on current or past state(s) (e.g., as developed or maintained by the perception system 140). In some implementations, future state(s) can be or include forecasted trajectories (e.g., positions over time) of the objects in the environment, such as other actors. In some implementations, one or more of the future state(s) can include one or more probabilities associated therewith (e.g., marginal probabilities, conditional probabilities). For example, the one or more probabilities can include one or more probabilities conditioned on the strategy or trajectory options available to the autonomous vehicle. Additionally, or alternatively, the probabilities can include probabilities conditioned on trajectory options available to one or more other actors.

To implement selected motion plan(s), the sub-control system(s) 101 can include a control system 160 (e.g., a vehicle control system). Generally, the control system 160 can provide an interface between the sub-control system(s) 101 and the platform control devices 112 for implementing the strategies and motion plan(s) generated by the planning system 150. For instance, the control system 160 can implement the selected motion plan/trajectory to control the autonomous platform's motion through its environment by following the selected trajectory (e.g., the waypoints included therein). The control system 160 can, for example, translate a motion plan into instructions for the appropriate platform control devices 112 (e.g., acceleration control, brake control, steering control, etc.). By way of example, the control system 160 can translate a selected motion plan into instructions to adjust a steering component (e.g., a steering angle) by a certain number of degrees, apply a certain magnitude of braking force, increase/decrease speed, etc. In some implementations, the control system 160 can communicate with the platform control devices 112 through communication channels including, for example, one or more data buses (e.g., controller area network (CAN), etc.), onboard diagnostics connectors (e.g., OBD-II, etc.), or a combination of wired or wireless communication links. The platform control devices 112 can send or obtain data, messages, signals, etc. to or from the sub-control system(s) 101 (or vice versa) through the communication channel(s).

The sub-control system(s) 101 can receive, through communication interface(s) 106, assistive signal(s) from remote assistance system 170. Remote assistance system 170 can communicate with the sub-control system(s) 101 over a network. In some implementations, the sub-control system(s) 101 can initiate a communication session with the remote assistance system 170. For example, the sub-control system(s) 101 can initiate a session based on or in response to a trigger. In some implementations, the trigger may be an alert, an error signal, a map feature, a request, a location, a traffic condition, a road condition, etc.

After initiating the session, the sub-control system(s) 101 can provide context data to the remote assistance system 170. The context data may include sensor data 104 and state data of the autonomous vehicle. For example, the context data may include a live camera feed from a camera of the autonomous vehicle and the autonomous vehicle's current speed. An operator (e.g., human operator) of the remote assistance system 170 can use the context data to select assistive signals. The assistive signal(s) can provide values or adjustments for various operational parameters or characteristics for the sub-control system(s) 101. For instance, the assistive signal(s) can include way points (e.g., a path around an obstacle, lane change, etc.), velocity or acceleration profiles (e.g., speed limits, etc.), relative motion instructions (e.g., convoy formation, etc.), operational characteristics (e.g., use of auxiliary systems, reduced energy processing modes, etc.), or other signals to assist the sub-control system(s) 101.

The sub-control system(s) 101 can use the assistive signal(s) for input into one or more autonomy subsystems for performing autonomy functions. For instance, the planning system 150 can receive the assistive signal(s) as an input for generating a motion plan. For example, assistive signal(s) can include constraints for generating a motion plan. Additionally or alternatively, assistive signal(s) can include cost or reward adjustments for influencing motion planning by the planning system 150. Additionally, or alternatively, assistive signal(s) can be considered by the sub-control system(s) 101 as suggestive inputs for consideration in addition to other received data (e.g., sensor inputs, etc.).

The sub-control system(s) 101 may be platform agnostic, and the control system 160 can provide control instructions to platform control devices 112 for a variety of different platforms for autonomous movement (e.g., a plurality of different autonomous platforms fitted with autonomous control systems). This can include a variety of different types of autonomous vehicles (e.g., sedans, vans, SUVs, trucks, electric vehicles, combustion power vehicles, etc.) from a variety of different manufacturers/developers that operate in various different environments and, in some implementations, perform one or more vehicle services.

Figure 2:
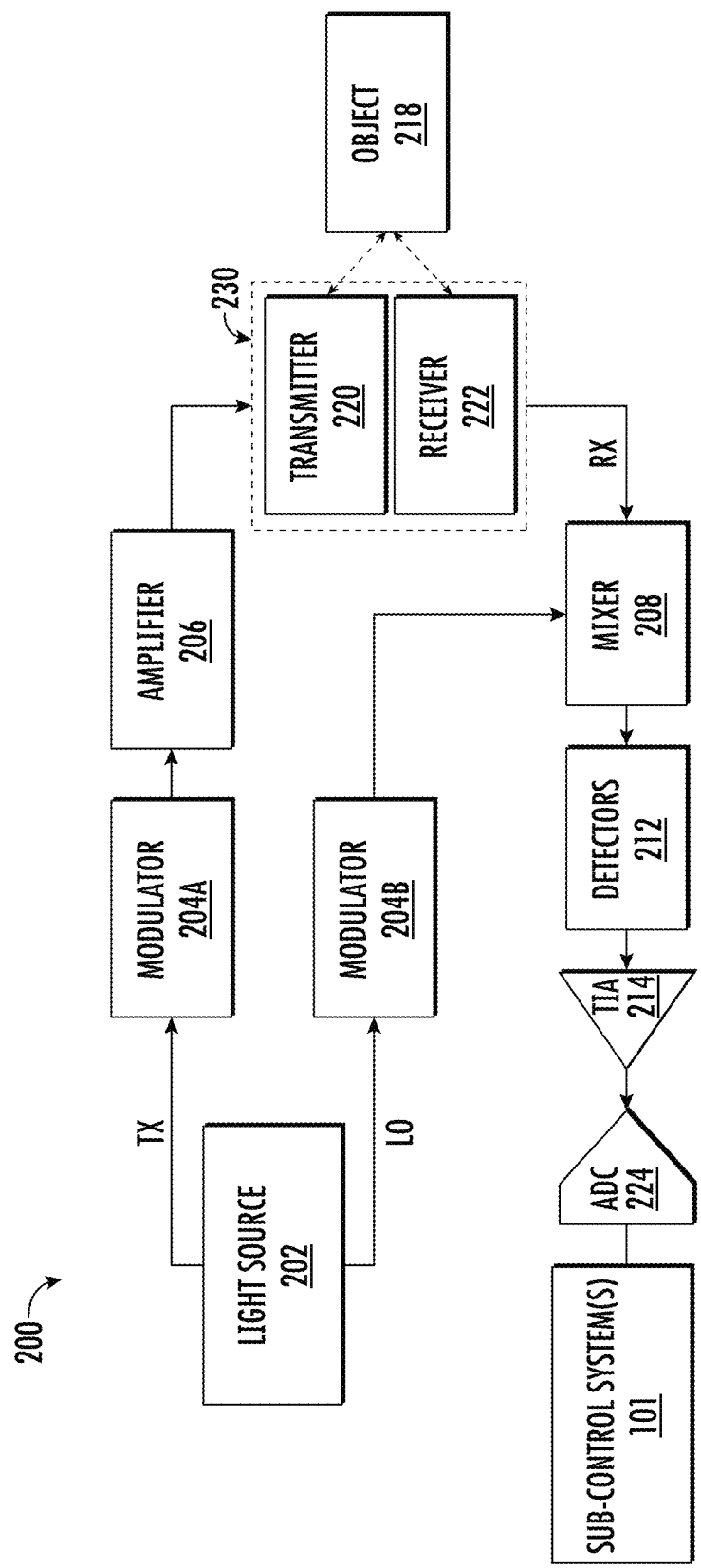
FIG. 2 depicts a block diagram of an example LIDAR system according to some implementations of the disclosure.

FIG. 2 is a block diagram illustrating a LIDAR system for autonomous vehicles, according to some implementations. The environment includes a LIDAR system 200 that includes a transmit (Tx) path and a receive (Rx) path. The Tx path includes one or more Tx input/output ports (e.g., channels), and the Rx path includes one or more Rx input/output ports (e.g., channels). In some implementations, a semiconductor substrate and/or semiconductor package may include the Tx path and/or the Rx path. In some implementations, the semiconductor substrate and/or semiconductor package may include at least one of silicon photonics circuitry, programmable logic controller (PLC), or group III-V semiconductor circuitry.

In some implementations, a first semiconductor substrate and/or a first semiconductor package may include the Tx path and a second semiconductor substrate and/or a second semiconductor package may include the Rx path. In some arrangements, the Rx input/output ports and/or the Tx input/output ports may occur (or be formed/disposed/located/placed) along one or more edges of one or more semiconductor substrates and/or semiconductor packages.

The LIDAR system 200 can be coupled to one or more sub-control system(s) 101 (e.g., the sub-control system(s) 101 of FIG. 1). In some implementations, the sub-control system(s) 101 may be coupled to the Rx path via the one or more Rx input/output ports. For instance, the sub-control system(s) 101 can receive LIDAR outputs from the LIDAR system 200. The sub-control system(s) 101 can control a vehicle (e.g., an autonomous vehicle) based on the LIDAR outputs.

The Tx path may include a light source (e.g., laser source) 202, a modulator 204A, a modulator 204B, an amplifier 206, and one or more transmitters 220. The Rx path may include one or more receivers 222, a mixer 208, a detector 212, a transimpedance amplifier (TIA) 214, and one or more analog-to-digital converters (ADCs) 224. Although FIG. 2 shows only a select number of components and only one input/output channel, the LIDAR system 200 may include any number of components and/or input/output channels (in any combination) that are interconnected in any arrangement to facilitate combining multiple functions of a LIDAR system, to support the operation of a vehicle.

The light source 202 may be configured to generate a light signal (or beam) that is derived from (or associated with) a local oscillator (LO) signal. In some implementations, the light signal may have an operating wavelength that is equal to or substantially equal to 1550 nanometers. In some implementations, the light signal may have an operating wavelength that is between 1400 nanometers and 1440 nanometers.

The light source 202 may be configured to provide the light signal to the modulator 204A, which is configured to modulate a phase and/or a frequency of the light signal based on a first radio frequency (RF) signal (e.g., an "RF1" signal) to generate a modulated light signal, such as by Continuous Wave (CW) modulation or quasi-CW modulation. The modulator 204A may be configured to send the modulated light signal to the amplifier 206. The amplifier 206 may be configured to amplify the modulated light signal to generate an amplified light signal for transmission via the one or more transmitters 220. The one or more transmitters 220 may include one or more optical waveguides or antennas. In some implementations, modulator 204A and/or modulator 204B may have a bandwidth between 400 megahertz (MHz) and 1000 (MHz).

The LIDAR system 200 includes one or more transmitters 220 and one or more receivers 222. The transmitter(s) 220 and/or receiver(s) 222 can be included in a transceiver 230. The transmitter(s) 220 can provide the transmit beam that it receives from the Tx path into an environment within a given field of view toward an object 218. The one or more receivers 222 can receive a received beam reflected from the object 218 and provide the received beam to the mixer 208 of the Rx path. The one or more receivers 222 may include one or more optical waveguides or antennas. In some arrangements, the one or more transceivers 230 may include a monostatic transceiver or a bistatic transceiver.

The light source 202 may be configured to provide the LO signal to the modulator 204B, which is configured to modulate a phase and/or a frequency of the LO signal based on a second RF signal (e.g., an "RF2" signal) to generate a modulated LO signal (e.g., using Continuous Wave (CW) modulation or quasi-CW modulation) and send the modulated LO signal to the mixer 208 of the Rx path. The mixer 208 may be configured to mix (e.g., combine, multiply, etc.) the modulated LO signal with the returned signal to generate a down-converted signal and send the down-converted signal to the detector 212.

In some arrangements, the mixer 208 may be configured to send the modulated LO signal to the detector 212. The detector 212 may be configured to generate an electrical signal based on the down-converted signal and send the electrical signal to the TIA 214. In some arrangements, the detector 212 may be configured to generate an electrical signal based on the down-converted signal and the modulated signal. The TIA 214 may be configured to amplify the electrical signal and send the amplified electrical signal to the sub-control system(s) 101 via the one or more ADCs 224. In some implementations, the TIA 214 may have a peak noise-equivalent power (NEP) that is less than 5 picowatts per square root Hertz (i.e., 5×10-12 Watts per square root Hertz). In some implementations, the TIA 214 may have a gain between 4 kiloohms and 25 kiloohms. In some implementations, detector 212 and/or TIA 214 may have a 3-decibel bandwidth between 80 kilohertz (kHz) and 450 megahertz (MHz).

The sub-control system(s) 101 may be configured to determine a distance to the object 218 and/or measure the velocity of the object 218 based on the one or more electrical signals that it receives from the TIA 214 via the one or more ADCs 224.

Figure 3A:
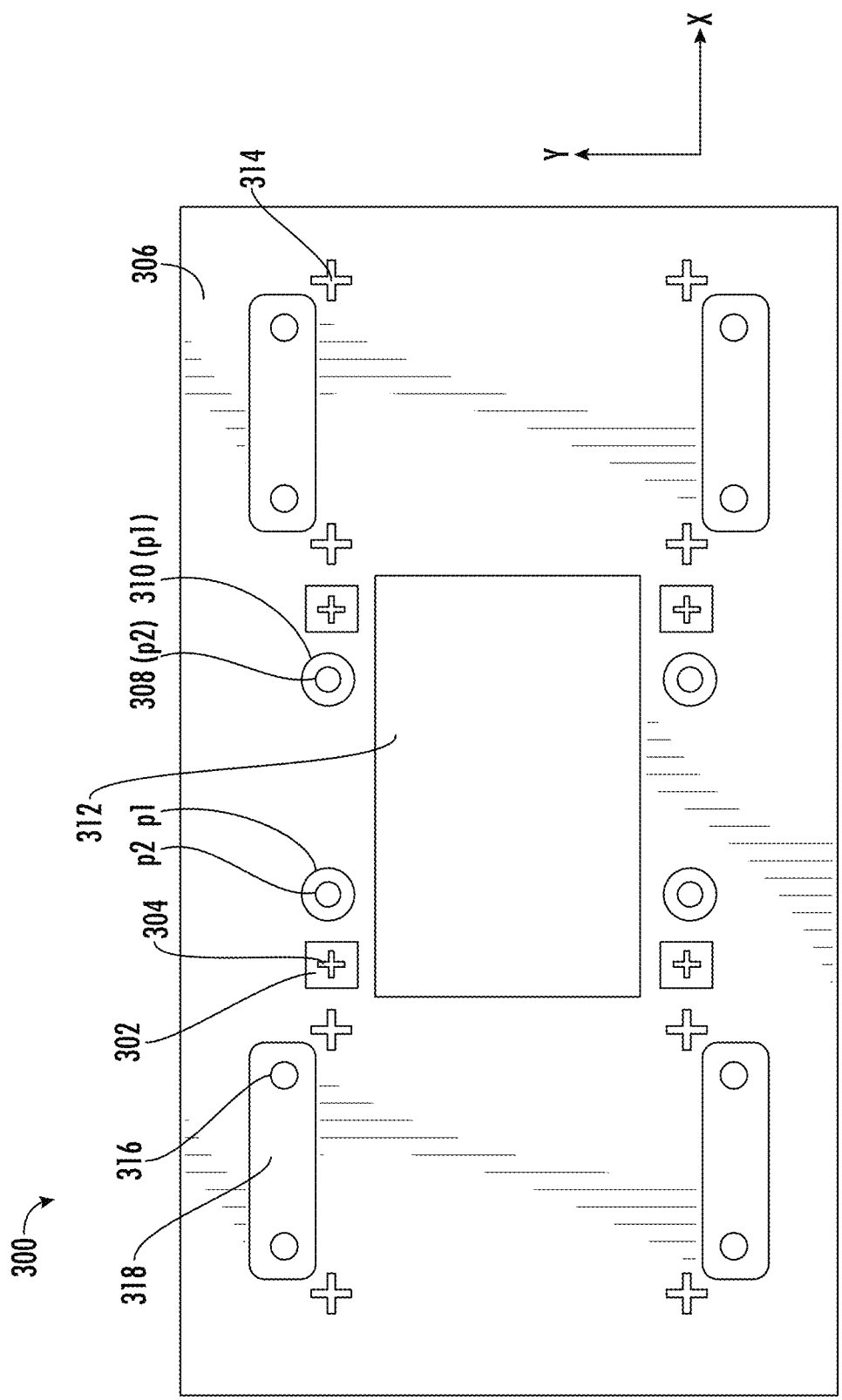
Figure 3C:
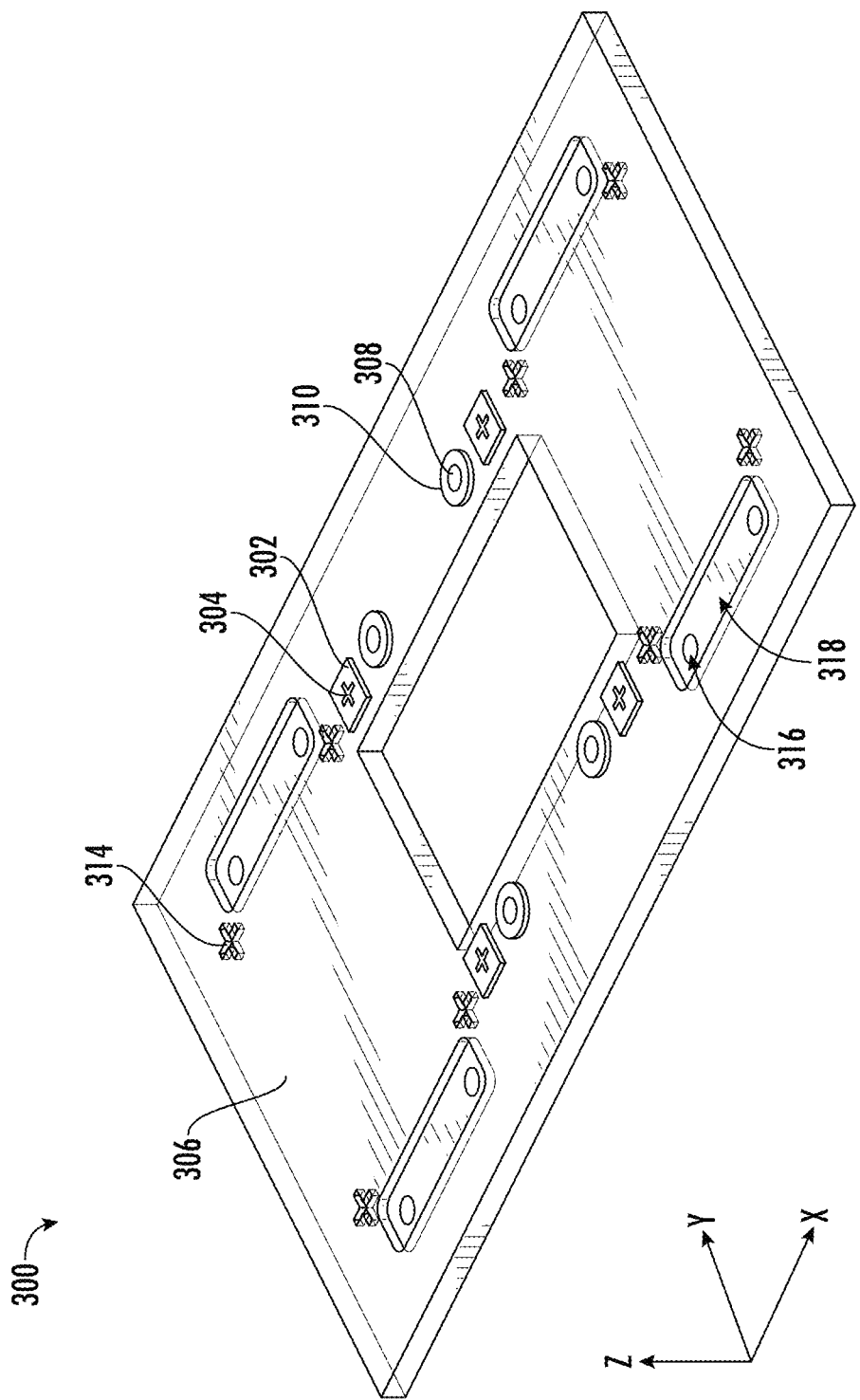

FIGS. 3A-3C depict a first optical component 300 which can be coupled to one or more other optical components in an optical system of a LIDAR system according to some implementations of the disclosure. The first optical component 300 can be included in a LIDAR system, such as the LIDAR system 200 of FIG. 2 and the like.

The first optical component 300 may correspond to a silicon chip, for example a silicon interposer chip. The silicon interposer chip in the LIDAR system 200 can serve as a bridge between different photonic components, including a semiconductor optical amplifier (SOA) chip and a silicon photonics integrated circuit chip (Si PIC). The silicon interposer chip can include optical and electrical interconnections that facilitate the integration and communication between other optical components. Referring to the top view of the first optical component 300 in FIG. 3A, side view of FIG. 3B, and perspective view of FIG. 3C, the first optical component 300 may include one or more mechanical stops (pedestals) 302. The one or more mechanical stops 302 can be utilized for out-of-plane alignment with a second optical component 410 (see FIGS. 4A-4B). In some implementations, the one or more mechanical stops 302 may each include a fiducial mark 304 which may be etched in a surface of the corresponding mechanical stop. Each fiducial mark 304 may be utilized for in-plane alignment with the second optical component 410. In the embodiment of FIGS. 3A-3C, the first optical component 300 includes four mechanical stops 302 each having a fiducial mark 304. However, this disclosure is not limited to this example and the first optical component 300 can include more or less than four mechanical stops. The first optical component 300 may include one or more under bump metal pads 308 onto which solder 310 is deposited or applied. In the embodiment of FIGS. 3A-3C, the first optical component 300 includes four under bump metal pads 308 each having solder 310 deposited thereon. However, the disclosure is not limited to this example and the first optical component 300 can include more or less than four under bump metal pads. Each of the under bump metal pads 308 may be disposed adjacent to a corresponding mechanical stop among the one or more mechanical stops 302. The first optical component 300 may also include a through-hole 312 (e.g., located in a central portion of the first optical component 300). The first optical component 300 may include one or more fiducial marks 314. For example, the one or more fiducial marks 314 can be etched in a surface 306 of the first optical component 300. The first optical component 300 can further include one or more under bump metal pads 316 which are disposed inside one or more recesses 318 of the first optical component 300. The one or more recesses 318 can be etched in the surface 306 of the first optical component 300. The one or more recesses 318 can be configured to house solder, for example. In the embodiment of FIGS. 3A-3C, the first optical component 300 includes eight fiducial marks 314 (e.g., four fiducial marks 314 on one side of the through-hole 312 and four fiducial marks 314 on another side of the through-hole 312). However, the disclosure is not limited to this example and the first optical component 300 can include more or less than eight fiducial marks 314 and be disposed at other locations than that shown. In the example embodiment of FIGS. 3A-3C, the first optical component 300 includes four recesses 318 each having two under bump metal pads 316. However, the disclosure is not limited to this example and the first optical component 300 can include more or less than four recesses and the recesses can have more or less than two under bump metal pads. Although FIGS. 3A-3C illustrate square-shaped mechanical stops 302 and cross-shaped fiducial marks 304, 314, mechanical stops 302 and/or fiducial marks 304, 314 may have alternative shapes in accordance with other embodiments of the disclosed technology.

As illustrated in FIG. 3A, the first optical component 300 has solder 310 which is pre-deposited on one of the under bump metal pads 308 on a surface of dielectric material (e.g., silicon dioxide). The pre-deposited solder 310 is provided such that the footprint or area of the solder 310 is greater than the footprint or area of the under bump metal pad 308 (before heating or melting of the solder 310). For example, the perimeter p1 of the solder 310 (e.g., a circumference of the solder 310 when the solder 310 has a circular shape) may be greater than the perimeter p2 of the under bump metal pad 308 (e.g., a circumference of the under bump metal pad 308 when the under bump metal pad 308 has a circular shape). For example, the width or diameter of the solder 310 may be greater than the width or diameter of the under bump metal pad 308 (e.g., in the x-direction shown in FIG. 3A). In FIG. 3B, a side view of the first optical component 300 is shown. As illustrated in FIG. 3B, the height h1 of the mechanical stop 302 is greater than the height h2 of the pre-deposited solder 310 (before heating or melting of the solder 310). The height h1 and height h2 are defined in the z-direction as shown in FIG. 3B. For example, the height h1 of the mechanical stop 302 is greater than the combined height of the under bump metal pad 308 and the pre-deposited solder 310 (before heating or melting of the solder 310). As described herein, when the second optical component 410 is coupled to the first optical component 300, the solder 310 is not in contact with (i.e., is spaced apart from) the second optical component 410 in the z-direction while the one or more mechanical stops 302 may be configured to support the second optical component 410. For example, the solder 310 does not come into contact with the second optical component 410 when the first optical component 300 and the second optical component 410 are coupled or pressed together at the end of an alignment operation (e.g., a flip chip operation using a flip chip bonding machine or flip chip system).

Figure 4A:
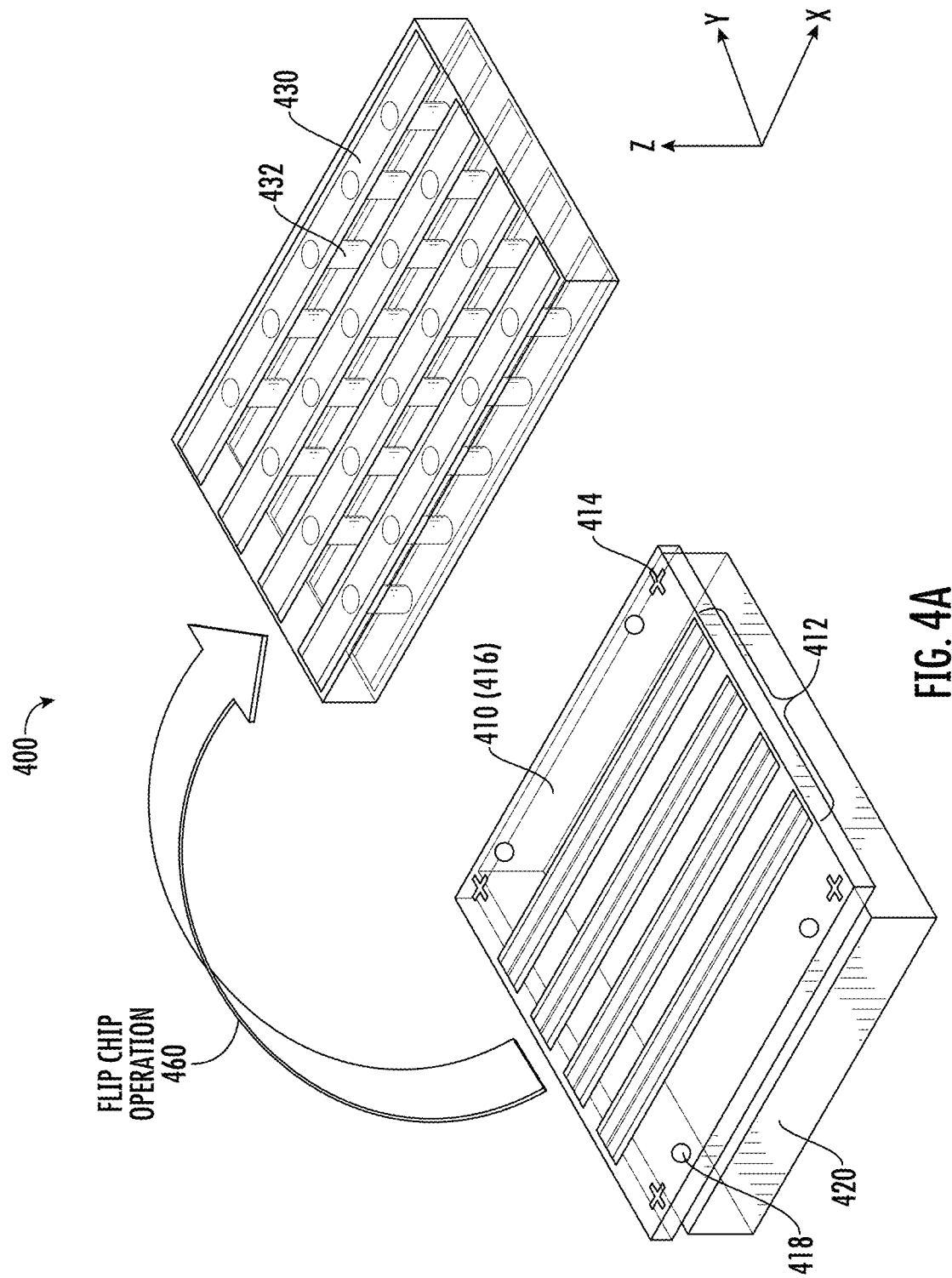
FIGS. 4A-4B are views of an example second optical component having heat spreaders coupled thereto, for a LIDAR system, according to some implementations of the disclosure.
Figure 4B:
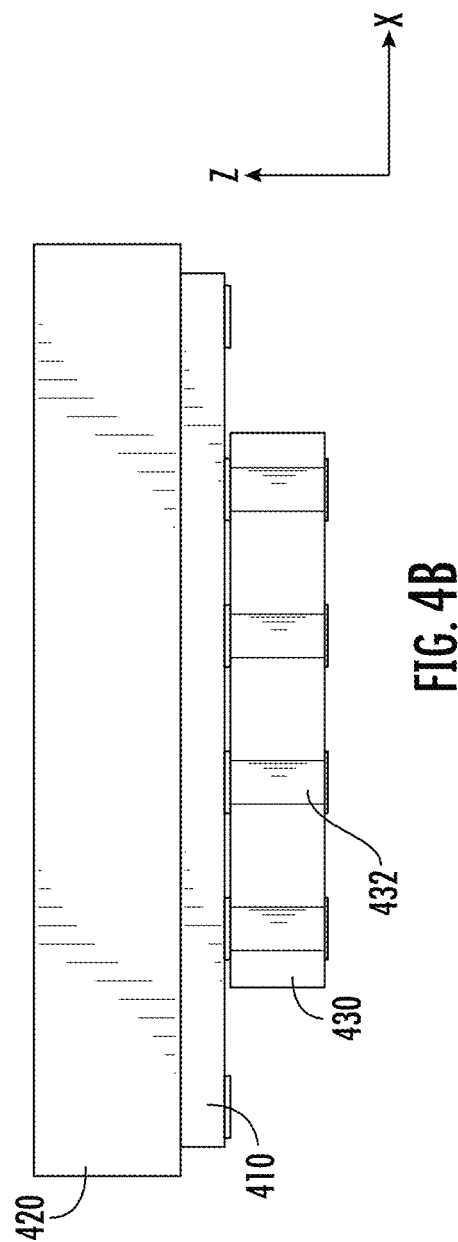

FIGS. 4A-4B are views of an example second optical component having heat spreaders coupled thereto, according to some implementations of the disclosure. FIG. 4A depicts an example process 400 for bonding heat spreaders to a second optical component 410 which can be coupled to one or more other optical components in an optical system for a LIDAR system according to some implementations of the disclosure. The second optical component 410 coupled to the heat spreaders can be included in a LIDAR system, such as the LIDAR system 200 of FIG. 2 and the like.

Referring to FIG. 4A, a first operation of the process 400 includes coupling a first heat spreader 420 (e.g., a submount optical component or a submount optical chip) to a first side of the second optical component 410. In some implementations, the first heat spreader 420 may be coupled to the second optical component 410 via a bonding material (e.g., epoxy, glue, etc.).

The second optical component 410 may correspond to a semiconductor optical amplifier (SOA) chip. In some implementations, the second optical component 410 may include a plated metal film, such as a film including gold, a gold alloy, and/or other suitable conductive metal (e.g., to function as a heat spreader). The second optical component 410 may include a plurality of waveguides 412 (array of optical waveguides) and one or more optical facets where light can be either coupled in or out of the plurality of waveguides 412. The second optical component 410 may include one or more fiducial marks 414 which may be etched in a surface 416 of the second optical component 410 (e.g. a surface of dielectric material such as silicon dioxide). Each fiducial mark 414 may be utilized for in-plane alignment with the first optical component 300. In the example embodiment of FIGS. 4A-4B, the second optical component 410 includes four fiducial marks 414. However, the disclosure is not limited to this example and the second optical component 410 can include more or less than four fiducial marks.

The second optical component 410 may include one or more under bump metal pads 418 for bonding with the solder 310 of the first optical component 300. In the example embodiment of FIGS. 4A-4B, the second optical component 410 includes four under bump metal pads 418. For example, each of the under bump metal pads 418 may be disposed adjacent to an edge of the second optical component 410 and/or a corresponding fiducial mark among the one or more fiducial marks 414. However, the disclosure is not limited to this example and the second optical component 410 can include more or less than four under bump metal pads and may be disposed at other locations than that shown.

A second operation of the process 400 includes implementing a flip chip operation 460 to flip over the second optical component 410 having the first heat spreader 420 coupled thereto, and coupling a second heat spreader 430 (e.g., a submount optical component or a submount optical chip) to a second side of the second optical component 410. In some implementations, the second heat spreader 430 may be coupled to the second optical component 410 via a bonding material (e.g., epoxy, glue, etc.). In some implementations, the first heat spreader 420 and/or the second heat spreader 430 can be thermally conductive. For example, as depicted in FIGS. 4A and 4B, the first heat spreader 420 and/or the second heat spreader 430 can include a plurality of through-chip vias 432 which may be filled with metal for electrical conductivity.

The second optical component 410 having the first heat spreader 420 and the second heat spreader 430 coupled thereto, can be inserted into the through-hole 312 of the first optical component 300. In some implementations, the second heat spreader 430 may be disposed entirely or partially below an outer (out-of-plane) surface 306 of the first optical component 300. In some implementations, the second heat spreader 430 may be disposed entirely or partially below an inner (in-plane) surface of a recess 318 of the first optical component 300.

As described herein, in some implementations, the first optical component 300 can also be coupled to a carrier (heat sink). In some implementations, the second heat spreader 430 may be coupled to the carrier (e.g., electrically and/or thermally), where the carrier serves as both a heat sink and an electrical terminal for the optical system. In some implementations, the carrier may be coupled to the first optical component 300 and/or the second heat spreader 430 via a bonding material (e.g., epoxy, glue, etc.).

Figure 5A:
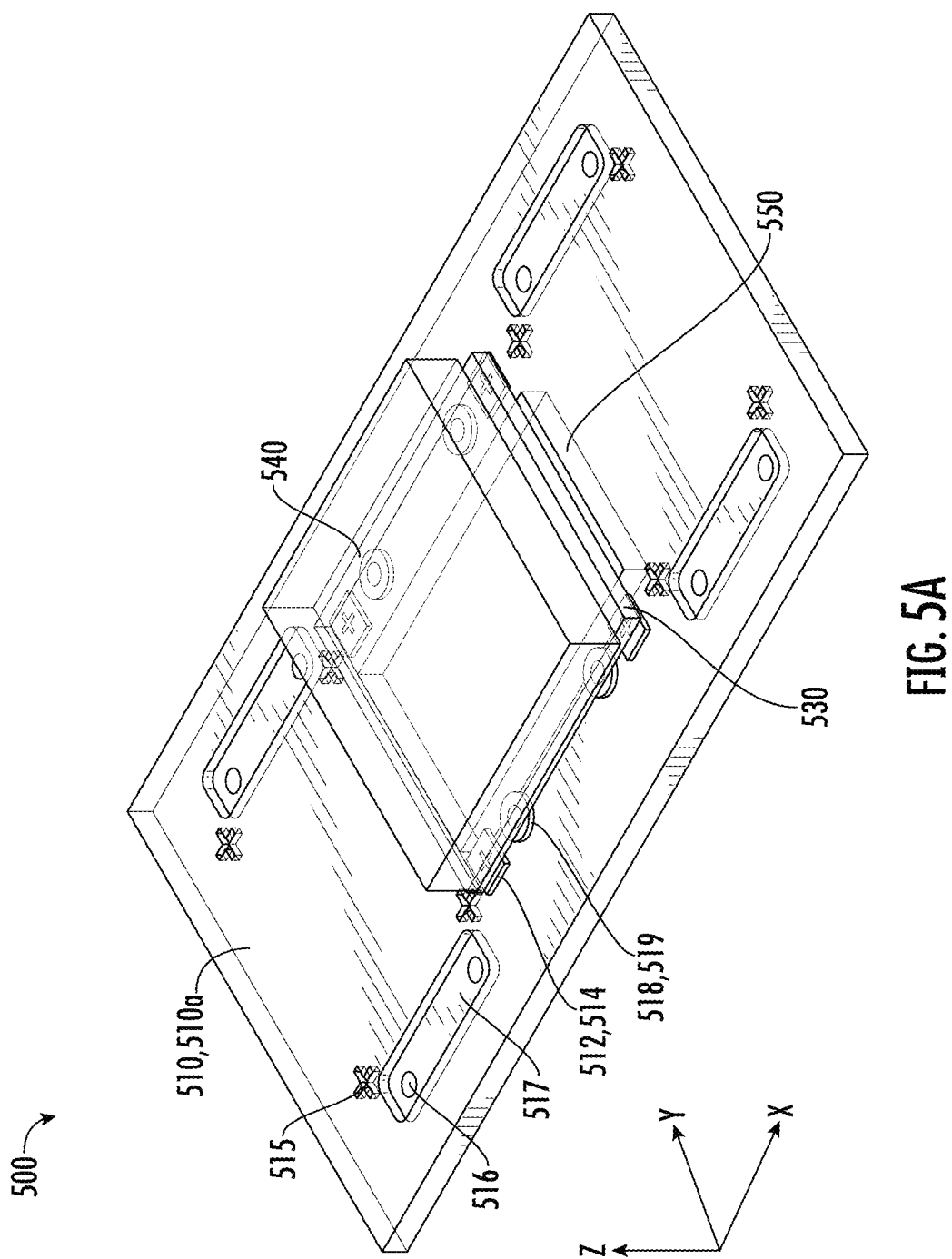
FIGS. 5A-5C are views of an example optical system for a LIDAR system, according to some implementations of the disclosure.
Figure 5B:
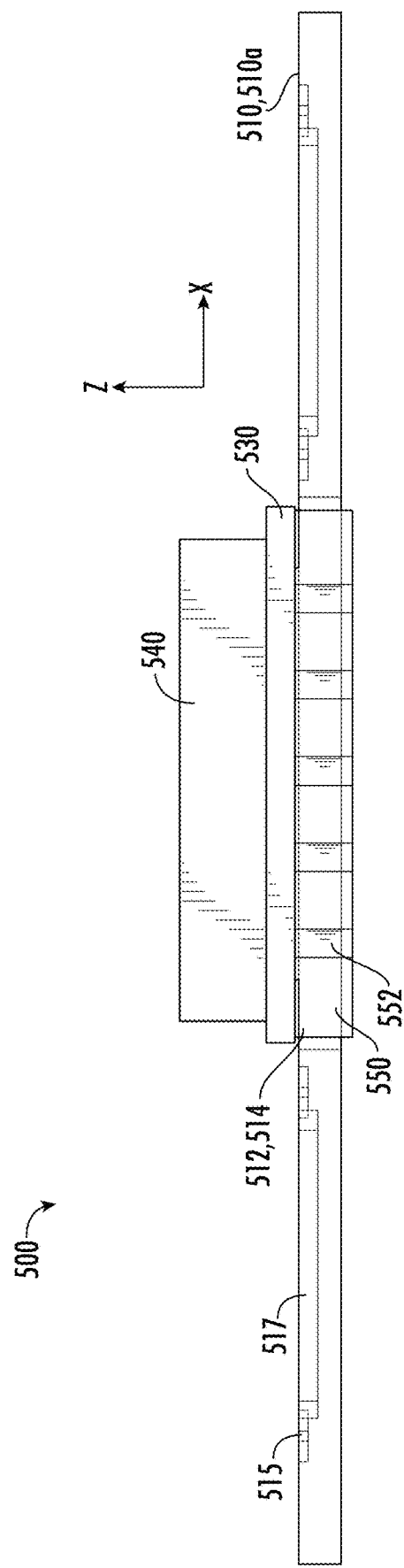
Figure 5C:
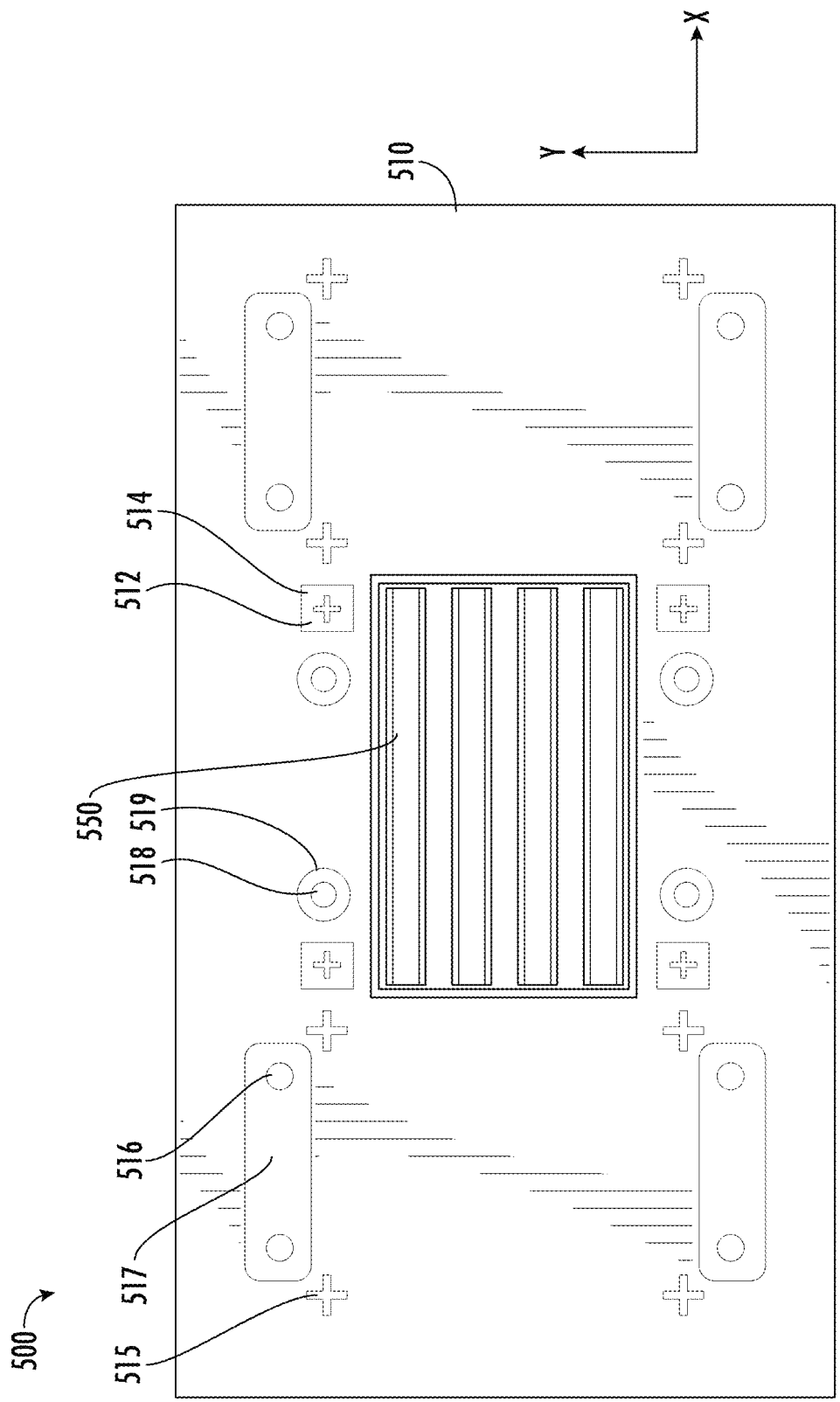

FIGS. 5A-5C depict an example optical system having a first optical component coupled to a second optical component for a LIDAR system, according to some implementations of the disclosure. The optical system can be included in a LIDAR system, such as the LIDAR system 200 of FIG. 2 and the like.

Referring to the perspective view of FIG. 5A, side view of FIG. 5B, and bottom view of FIG. 5C, an optical system 500 includes a first optical component 510 which is coupled to a second optical component 530. The first optical component 510 includes a plurality of mechanical stops (e.g., pedestals) 512, fiducial marks (a first plurality of fiducial marks) 514 respectively etched in the plurality of mechanical stops 512, a plurality of under bump metal pads 518 each having solder 519 pre-deposited thereon, fiducial marks (a second plurality of fiducial marks) 515 etched in a surface 510a of the first optical component 510, and a plurality of under bump metal pads 516 which are respectively disposed inside recesses (recessed portions etched in the surface 510a of the first optical component 510) 517. For example, the first optical component 510 can correspond to a silicon chip, for example a silicon interposer chip as described with respect to the first optical component 300 of FIGS. 3A-3C, and therefore a detailed description of the features of the first optical component 510 will not be repeated for the sake of brevity.

The second optical component 530 includes a plurality of waveguides (array of optical waveguides), one or more optical facets where light can be either coupled in or out of the plurality of waveguides, a plurality of fiducial marks for in-plane alignment with the first optical component 510, and a plurality of under bump metal pads for bonding with the solder 519 of the first optical component 510. In some implementations, the second optical component 530 may include a plated metal film, such as a film including gold, a gold alloy, and/or other suitable conductive metal. For example, the second optical component 530 can correspond to a semiconductor optical amplifier (SOA) chip as described with respect to the second optical component 410 of FIGS. 4A-4B, and therefore a detailed description of the features of the second optical component 530 will not be repeated for the sake of brevity.

As illustrated in FIGS. 5A-5C, a first heat spreader 540 (e.g., a submount optical component or a submount optical chip) is coupled to a first side of the second optical component 530. In some implementations, the first heat spreader 540 may be coupled to the second optical component 530 via a bonding material (e.g., epoxy, glue, etc.). A second heat spreader 550 (e.g., a submount optical component or a submount optical chip) is coupled to a second side of the second optical component 530. In some implementations, the second heat spreader 550 may be coupled to the second optical component 530 via a bonding material (e.g., epoxy, glue, etc.). In some implementations, the first heat spreader 540 and/or the second heat spreader 550 can be thermally conductive. For example, the first heat spreader 540 and/or the second heat spreader 550 can include a plurality of through-chip vias 552 which may be filled with metal for electrical conductivity. The second optical component 530 having the first heat spreader 540 and the second heat spreader 550 coupled thereto, can be inserted into a through-hole of the first optical component 510 (e.g., similar to the through-hole 312 of FIG. 3A). In some implementations, the second heat spreader 550 may be disposed entirely or partially below an outer (out-of-plane) surface of the first optical component 510. In some implementations, the second heat spreader 550 may be disposed entirely or partially below an inner (in-plane) surface of the recesses 517 of the first optical component 510. In some implementations, the second heat spreader 550 can also protrude out of a lower surface of the first optical component 510 (e.g., in a direction opposite of the second optical component 530) and can be coupled to a carrier electrically and/or thermally. In some implementations, the first heat spreader 540 and/or the second heat spreader 550 may be formed by or include a plated metal film, such as a film including gold, a gold alloy, and/or other suitable conductive metal.

According to examples of the disclosure, a flip chip bonding machine or flip chip system may be implemented to perform a flip chip operation to align the first optical component 510 and the second optical component 530. For example, fiducial marks on the mating surfaces of the first optical component 510 and the second optical component 530 can be aligned to achieve submicron in-plane alignment accuracy (e.g., fiducial marks 514 of first optical component 510 and fiducial marks 514 of the first optical component 510 as shown in FIG. 5A). For example, the flip chip bonding machine may be implemented to hold the second optical component 530 with significant force in a direction toward the first optical component 510 (e.g., in the z-direction) during the bonding process to prevent relative lateral and vertical shifts of the first optical component 510 and the second optical component 530. The positioning of the second optical component 530 may be determined by the plurality of mechanical stops 512 built into the first optical component 510, and a bonding material, such as the solder 519. For example, when the solder 519 is melted, the solder 519 can be induced to fill in a metal trace pre-defined on a surface of the second optical component 530, while the first optical component 510 and the second optical component 530 are held together as one rigid body. Thus, the first optical component 510 and the second optical component 530 are bonded by melting the pre-deposited solder (e.g., the solder 310 as shown in FIG. 3B), causing the solder 519 to spread on the metal trace with which it is in contact, and to move into the gap between the first optical component 510 and the second optical component 530 via capillary force.

In response to heating (e.g., melting) the solder 519, the area or perimeter of the solder 519 decreases and the height of the solder 519 increases. For example, the solder 519 footprint or area can shrink to fit the size and/or shape of the under bump metal pad 518 during reflowing, increasing the solder 519 height to allow contact with the under bump metal pad of the second optical component 530. For example, the height of the solder 519 can increase so that the height of the solder 519 is equal or substantially equal to the height (e.g., height h1 shown in FIG. 3B) of the mechanical stop 512. For example, the area or perimeter of the solder 519 can decrease so that the area or perimeter of the solder 519 is equal or substantially equal to the area or perimeter (e.g., perimeter p2 shown in FIG. 3A) of the under bump metal pad 518 of the first optical component 510. The solder 519 can be induced to shrink its footprint or area (e.g., due to surface energy minimization principles) and to grow its height upon melting, by manipulating different wetting properties with metal and dielectric materials, thus leading to contact with the second optical component 530 to form the bond. Further, the plurality of mechanical stops 512 can support the second optical component 530 and define the alignment of the first optical component 510 and the second optical component 530 in the z-direction.

Figure 6A:
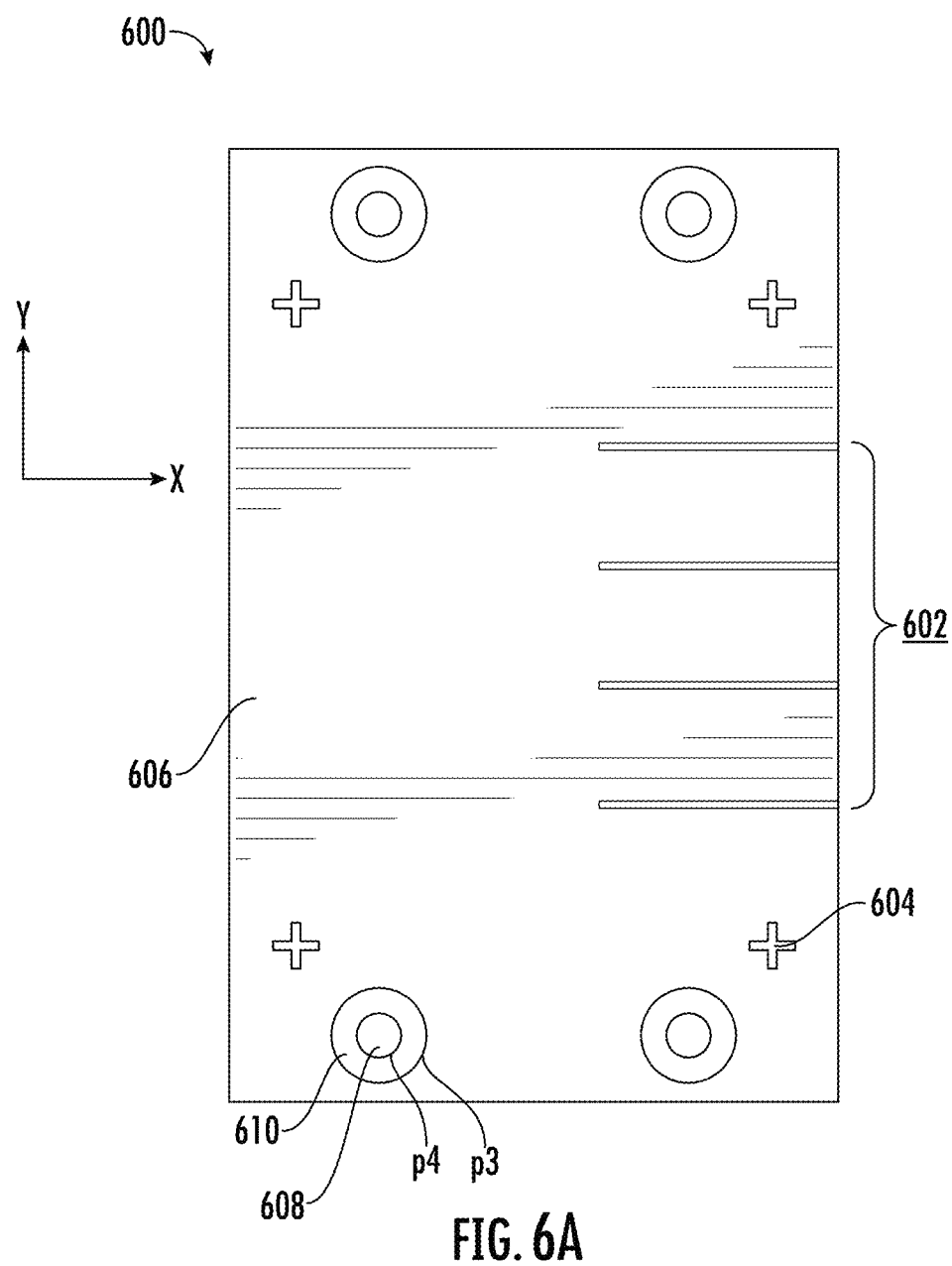
FIGS. 6A-6C are views of an example third optical component for an example optical system for a LIDAR system, according to some implementations of the disclosure.
Figure 6B:
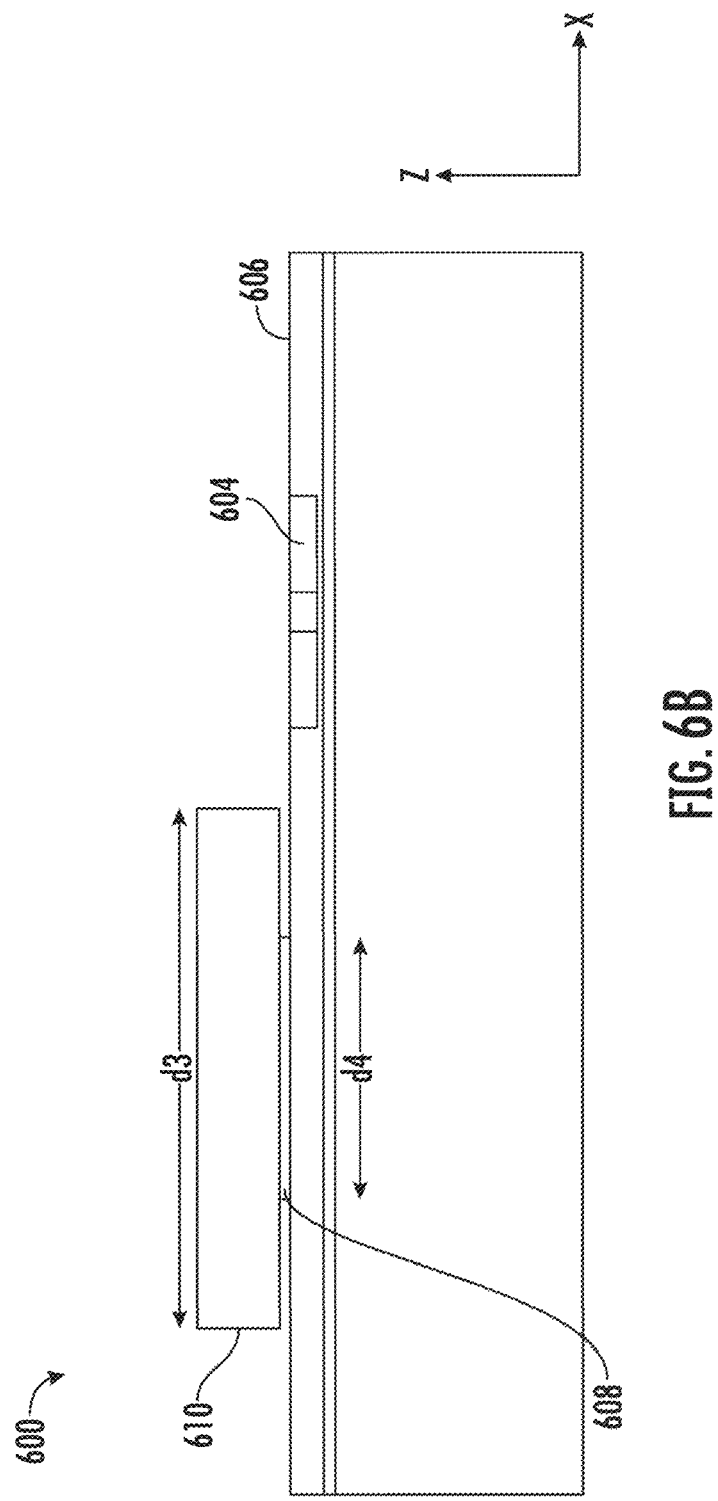
Figure 6C:
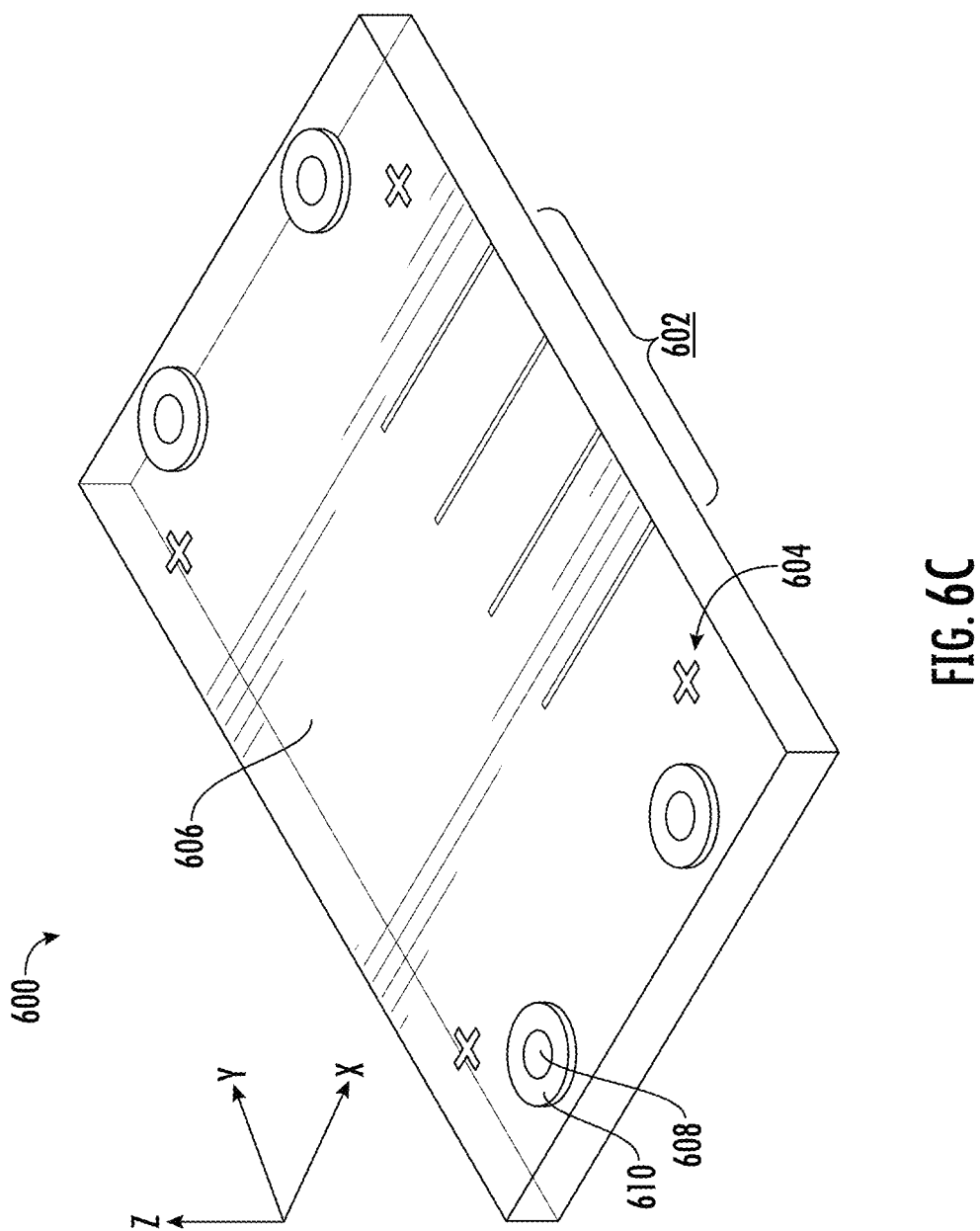

FIGS. 6A-6C depict a third optical component 600 which can be coupled to one or more other optical components in an optical system for a LIDAR system according to some implementations of the disclosure. The third optical component 600 can be included in a LIDAR system, such as the LIDAR system 200 of FIG. 2 and the like.

For example, the third optical component 600 may correspond to a silicon chip, for example a silicon photonics integrated circuit (Si PIC) chip. Referring to the top view of the third optical component 600 in FIG. 6A, side view of FIG. 6B, and perspective view of FIG. 6C, the third optical component 600 may include a plurality of waveguides 602 (array of optical waveguides) and one or more optical facets where light can be either coupled in or out of the plurality of waveguides 602. For example, the third optical component 600 may include two waveguides, three waveguides, four waveguides, etc. The third optical component 600 may include one or more fiducial marks 604 which may be etched in a surface 606 of the third optical component 600 (e.g. a surface of dielectric material such as silicon dioxide). Each fiducial mark 604 may be utilized for in-plane alignment with the first optical component 300. In the embodiment of FIGS. 6A-6C, the third optical component 600 includes four fiducial marks 604. However, the disclosure is not limited to this example and the third optical component 600 can include more or less than four fiducial marks. The third optical component 600 may include one or more under bump metal pads 608 onto which solder 610 is deposited or applied. In the embodiment of FIGS. 6A-6C, the third optical component 600 includes four under bump metal pads 608 each having solder 610 deposited thereon. For example, each of the under bump metal pads 608 may be disposed adjacent to an edge of the third optical component 600. However, the disclosure is not limited to this example and the third optical component 600 can include more or less than four under bump metal pads and may be disposed at other locations than that shown.

In FIG. 6B, a side view of a portion of the third optical component 600 is shown. As illustrated in FIG. 6B, the third optical component 600 has solder 610 which is pre-deposited on one of the under bump metal pads 608 on a surface 606 of the third optical component 600 (e.g., a surface of dielectric material such as silicon dioxide). The pre-deposited solder 610 is provided such that the footprint or area of the solder 610 is greater than the footprint or area of the under bump metal pad 608 (before heating or melting of the solder 610). For example, the area or perimeter p3 of the solder 610 (e.g., a circumference of the solder 610 when the solder 610 has a circular shape) may be greater than the perimeter p4 of the under bump metal pad 608 (e.g., a circumference of the under bump metal pad 608 when the under bump metal pad 608 has a circular shape). For example, the width or diameter d3 of the solder 610 may be greater than the width or diameter d4 of the under bump metal pad 608 (e.g., in the x-direction shown in FIG. 6B). As described herein, when the third optical component 600 is coupled to the first optical component 300, the solder 610 may not be in contact with (i.e., may be spaced apart from) the first optical component 300 in the z-direction. For example, the solder 610 does not come into contact with the first optical component 300 when the first optical component 300 and the third optical component 600 are coupled or pressed together at the end of an alignment operation (e.g., a flip chip operation using a flip chip bonding machine or flip chip system).

Figure 7A:
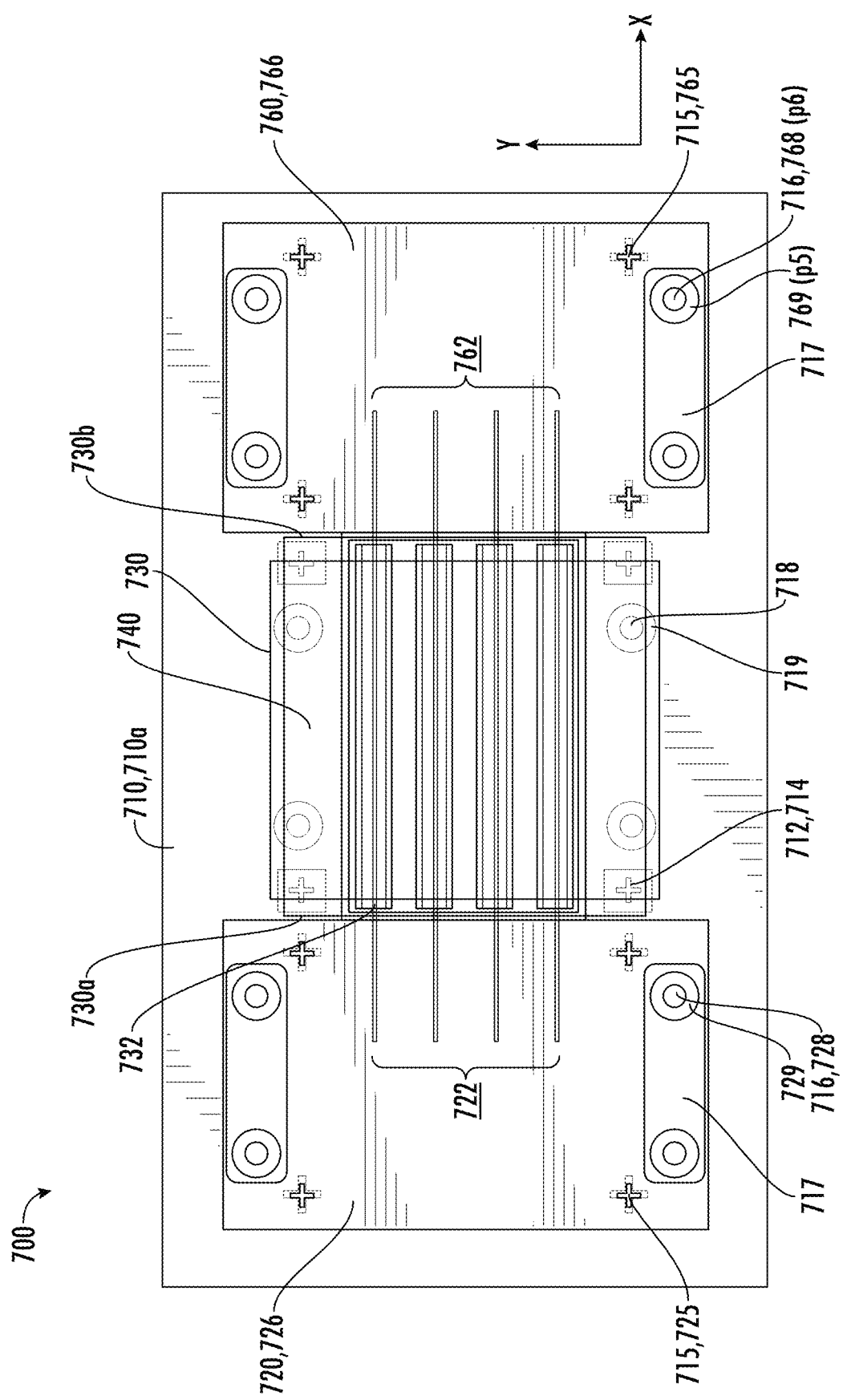
FIGS. 7A-7C are views of an example optical system for a LIDAR system, according to some implementations of the disclosure.
Figure 7B:
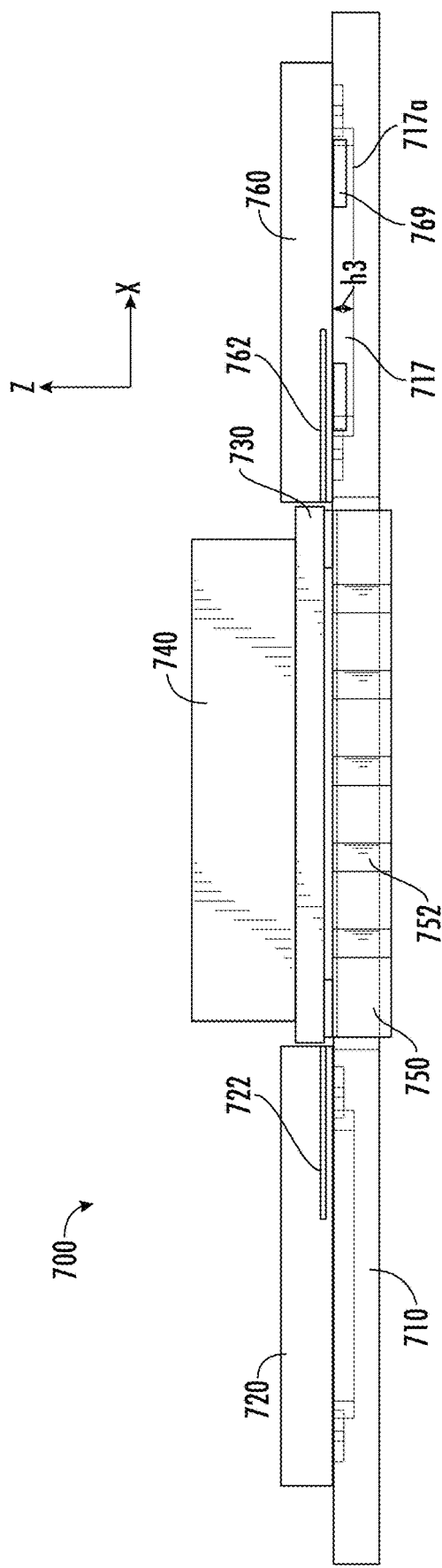
Figure 7C:
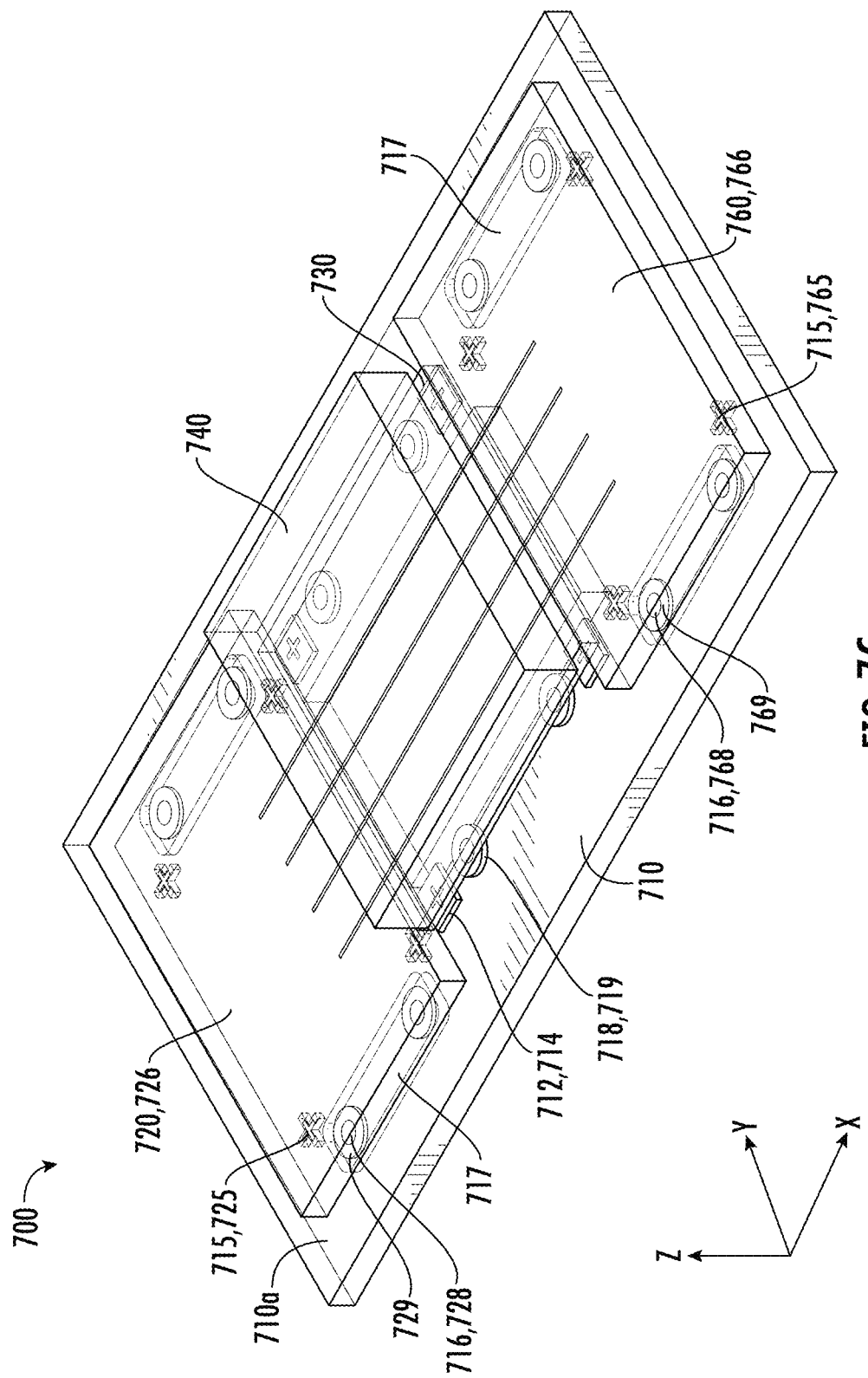

FIGS. 7A-7C depict an example optical system having a first optical component coupled to a second optical component, a third optical component, and a fourth optical component, for a LIDAR system, according to some implementations of the disclosure. The optical system can be included in a LIDAR system, such as the LIDAR system 200 of FIG. 2 and the like.

Referring to the top view of FIG. 7A, side view of FIG. 7B, and perspective view of FIG. 7C an optical system 700 includes a first optical component 710 which is coupled to a second optical component 730, a third optical component 720, and a fourth optical component 760. The first optical component 710 includes a plurality of mechanical stops 712 (pedestals), fiducial marks 714 (a first plurality of fiducial marks) respectively etched in the plurality of mechanical stops 712, a plurality of under bump metal pads 718 each having solder 719 pre-deposited thereon, fiducial marks 715 (a second plurality of fiducial marks) etched in a surface 710a of the first optical component 710, and a plurality of under bump metal pads 716 which are respectively disposed inside recesses 717 (recessed portions etched in the surface 710a of the first optical component 710). For example, the first optical component 710 can correspond to a silicon chip, for example a silicon interposer chip as described with respect to the first optical component 300 of FIGS. 3A-3C, and therefore a detailed description of the features of the first optical component 710 will not be repeated for the sake of brevity.

The third optical component 720 and fourth optical component 760 may each correspond to a silicon chip, for example a silicon photonics integrated circuit (Si PIC) chip. Referring to the top view of the third optical component 720 and fourth optical component 760 in FIG. 7A, side view of FIG. 7B, and perspective view of FIG. 7C, the third optical component 720 and fourth optical component 760 may each include a plurality of waveguides 722, 762 (array of optical waveguides) and one or more optical facets where light can be either coupled in or out of the plurality of waveguides 722, 762. For example, the third optical component 720 and fourth optical component 760 may each include two waveguides, three waveguides, four waveguides, etc. The third optical component 720 and fourth optical component 760 may each include one or more fiducial marks 725, 765 which may be etched in respective surfaces 726, 766 of the third optical component 720 and fourth optical component 760

(e.g. a surface of dielectric material such as silicon dioxide). Each fiducial mark 725, 765 may be utilized for in-plane alignment with the first optical component 710 (via the fiducial marks 715 of the first optical component 710). In the example embodiment of FIGS. 7A-7C, the third optical component 720 and fourth optical component 760 may each include four fiducial marks 725, 765. However, the disclosure is not limited to this example and the third optical component 720 and fourth optical component 760 may each include more or less than four fiducial marks. The third optical component 720 and fourth optical component 760 may each include one or more under bump metal pads 728, 768 onto which solder 729, 769 is respectively deposited or applied. In the example embodiment of FIGS. 7A-7C, the third optical component 720 and fourth optical component 760 may each include four under bump metal pads 728, 768 each having solder 729, 769 deposited thereon. For example, each of the under bump metal pads 728, 768 may be disposed adjacent to an edge of the third optical component 720 and fourth optical component 760, respectively. However, the disclosure is not limited to this example and the third optical component 720 and fourth optical component 760 can include more or less than four under bump metal pads and may be disposed at other locations than that shown. For example, the third optical component 720 and the fourth optical component 760 can correspond to a Si PIC chip as described with respect to the third optical component 600 of FIGS. 6A-6C, and therefore a detailed description of the features of the third optical component 720 and the fourth optical component 760 will not be repeated for the sake of brevity.

In FIG. 7B, a side view of a portion of the optical system 700 is shown. The example of FIG. 7B shows the fourth optical component 760 having solder 769 which is pre-deposited on one of the under bump metal pads on a surface of the fourth optical component 760 (e.g., a surface of dielectric material such as silicon dioxide). The pre-deposited solder 769 is provided such that the footprint or area of the solder 769 is greater than the footprint or area of the under bump metal pad 768 (before heating or melting of the solder 769). For example, the area or perimeter p5 of the solder 769 (e.g., a circumference of the solder 769 when the solder 769 has a circular shape) may be greater than the area or perimeter p6 of the under bump metal pad 768 (e.g., a circumference of the under bump metal pad 768 when the under bump metal pad 768 has a circular shape). For example, the width or diameter of the solder 769 may be greater than the width or diameter of the under bump metal pad 768 (e.g., in the x-direction shown in FIG. 7A). As described herein, when the fourth optical component 760 is coupled to the first optical component 710, the solder 769 may not be in contact with (i.e., may be spaced apart from) the first optical component 710 in the z-direction. For example, the solder 769 does not come into contact with the first optical component 710 (e.g., a surface 717a of the recess 717 of the first optical component 710) when the first optical component 710 and the fourth optical component 760 are coupled or pressed together at the end of an alignment operation (e.g., a flip chip operation using a flip chip bonding machine or flip chip system). The third optical component 720 can be coupled to the first optical component 710 in a manner similar to that described with respect to fourth optical component 760 being coupled to the first optical component 710.

In response to heating (e.g., melting) the solder 729, 769, the area or perimeter of the solder 729, 769 decreases and the height of the solder 729, 769 increases. For example, the footprint or area of the solder 729, 769 can shrink to fit the size and/or shape of the under bump metal pad 728, 768 during reflowing, increasing the solder 729, 769 height to allow contact with the corresponding under bump metal pad of the first optical component 710. For example, the height of the solder 729, 769 can increase so that the height of the solder 729, 769 is equal or substantially equal to the height h3 of the recess 717. For example, the area or perimeter of the solder 729, 769 can decrease so that the area or perimeter of the solder 729, 769 is equal or substantially equal to the area or perimeter of the corresponding under bump metal pad 728, 768 from the first optical component 710 and the fourth optical component 760. The solder 729, 769 can be induced to shrink its footprint or area (e.g., due to surface energy minimization principles) and to grow its height upon melting, by manipulating different wetting properties with metal and dielectric materials, thus leading to contact with the first optical component 710 to form the bond. The solder 729, 769 can be confined to be inside the recesses 717 of the first optical component 710.

The second optical component 730 includes a plurality of waveguides 732 (array of optical waveguides), one or more optical facets where light can be either coupled in or out of the plurality of waveguides, a plurality of fiducial marks for in-plane alignment with the first optical component 710, and a plurality of under bump metal pads for bonding with the solder 719 of the first optical component 710. For example, the second optical component 730 can correspond to a semiconductor optical amplifier (SOA) chip as described with respect to the second optical component 410 of FIGS. 4A-4B, and therefore a detailed description of the features of the second optical component 730 will not be repeated for the sake of brevity.

As illustrated in FIGS. 7A-7C, a first heat spreader 740 (e.g., a submount optical component or a submount optical chip) is coupled to a first side of the second optical component 730. In some implementations, the first heat spreader 740 may be coupled to the second optical component 730 via a bonding material (e.g., epoxy, glue, etc.). A second heat spreader 750 (e.g., a submount optical component or a submount optical chip) is coupled to a second side of the second optical component 730. In some implementations, the second heat spreader 750 may be coupled to the second optical component 730 via a bonding material (e.g., epoxy, glue, etc.). In some implementations, the first heat spreader 740 and/or the second heat spreader 750 can be thermally conductive. For example, the first heat spreader 740 and/or the second heat spreader 750 can include a plurality of through-chip vias 752 which may be filled with metal for electrical conductivity. The second optical component 730 having the first heat spreader 740 and the second heat spreader 750 coupled thereto, can be inserted into a through-hole of the first optical component 710 (e.g., similar to the through-hole 312 of FIG. 3A). In some implementations, the second heat spreader 750 may be disposed entirely or partially below an outer (out-of-plane) surface of the first optical component 710. In some implementations, the second heat spreader 750 may be disposed entirely or partially below an inner (in-plane) surface of the recesses 717 of the first optical component 710. In some implementations, the second heat spreader 750 can also protrude out of a lower surface of the first optical component 710 (e.g., in a direction opposite of the second optical component 730) and can be coupled to a carrier electrically and/or thermally.

According to examples of the disclosure, a flip chip bonding machine or flip chip system may be implemented to perform a flip chip operation to align the first optical component 710 and the second optical component 730. For example, fiducial marks on the mating surfaces of the first optical component 710 and the second optical component 730 can be aligned to achieve submicron in-plane alignment accuracy (e.g., fiducial marks 714 of first optical component 710 and fiducial marks 514 of the first optical component 510 as shown in FIG. 5A). For example, the flip chip bonding machine may be implemented to hold the second optical component 730 with significant force in a direction toward the first optical component 710 (e.g., in the z-direction) during the bonding process to prevent relative lateral and vertical shifts of the first optical component 710 and the second optical component 730. The positioning of the second optical component 730 may be determined by the plurality of mechanical stops 712 built into the first optical component 710, and a bonding material, such as the solder 719. For example, when the solder 719 is melted, the solder 719 can be induced to fill in a metal trace pre-defined on a surface of the second optical component 730, while the first optical component 710 and the second optical component 730 are held together as one rigid body. Thus, the first optical component 710 and the second optical component 730 are bonded by melting the pre-deposited solder (e.g., the solder 310 as shown in FIG. 3B), causing the solder 719 to spread on the metal trace with which it is in contact, and to move into the gap between the first optical component 710 and the second optical component 730 via capillary force.

In response to heating (e.g., melting) the solder 719, the area or perimeter of the solder 719 decreases and the height of the solder 719 increases. For example, the footprint or area of the solder 719 can shrink to fit the size and/or shape of the under bump metal pad 718 during reflowing, increasing the solder 719 height to allow contact with the under bump metal pad of the second optical component 730. For example, the height of the solder 719 can increase so that the height of the solder 719 is equal or substantially equal to the height (e.g., height h1 shown in FIG. 3B) of the mechanical stop 712. For example, the area or perimeter of the solder 719 can decrease so that the area or perimeter of the solder 719 is equal or substantially equal to the area or perimeter (e.g., perimeter p2 shown in FIG. 3A) of the under bump metal pad 718 of the first optical component 710. The solder 719 can be induced to shrink its footprint or area (e.g., due to surface energy minimization principles) and to grow its height upon melting, by manipulating different wetting properties with metal and dielectric materials, thus leading to contact with the second optical component 730 to form the bond. Further, the plurality of mechanical stops 712 can support the second optical component 730 and define the alignment of the first optical component 710 and the second optical component 730 in the z-direction.

When the third optical component 720, second optical component 730, and fourth optical component 760 are coupled to the first optical component 710, the plurality of waveguides 722 may be aligned with the plurality of waveguides 732 at a third side 730a of the second optical component 730 and the plurality of waveguides 762 may be aligned with the plurality of waveguides 732 at a fourth side 730b of the second optical component 730. For example, the optical facets of the third optical component 720 and fourth optical component 760 (e.g., Si PIC chips) face and almost meet opposite facets of the second optical component 730 (e.g., a SOA chip).

In some implementations, the second optical component 730 may be coupled to the first optical component 710 before the third optical component 720 and the fourth optical component 760. In some implementations, the third optical component 720 may be coupled to the first optical component 710 first, then the second optical component 730, and finally the fourth optical component 760. In some implementations, the fourth optical component 760 may be coupled to the first optical component 710 first, then the second optical component 730, and finally the third optical component 720. Other sequences are also possible.

In some implementations, solder disposed on a particular optical component can be heated (melted) when that particular optical component is coupled to another optical component via solder. For example, when the second optical component 730 is coupled to the first optical component 710, the solder 719 may be melted to bond the second optical component 730 with the first optical component 710. Then, the third optical component 720 may be coupled to the first optical component 710 and the solder 729 may be melted to bond the third optical component 720 with the first optical component 710. Finally, the fourth optical component 760 may be coupled to the first optical component 710 and the solder 769 may be melted to bond the fourth optical component 760 with the first optical component 710. Other sequences are also possible. When the order of coupling the optical components is changed, an order of heating of the solder for each respective optical component may also need to be changed, taking into considerations for solder reflow when a particular component is subjected to heating. In some implementations, local heating of the optical components can be implemented such that an order of coupling the optical components can be varied.

In some implementations, solder disposed on the optical components can be heated (melted) after all of the optical components are coupled to each other. For example, the second optical component 730, the third optical component 720, and the fourth optical component 760 may be coupled to the first optical component 710 and heat may be applied at the same or substantially the same time to solder 719, 729, 769 to bond the second optical component 730, the third optical component 720, and the fourth optical component 760 to the first optical component 710.

For example, heat can be applied to the solder deposited on the first optical component 710 by locally or globally heating the first optical component 710. For example, to locally heat the first optical component 710, heat can be applied or directed to solder deposited on one or more under bump metal pads. In some implementations, separate heaters (e.g., resistive heaters) may be provided or positioned at or near each location of the under bump metal pads 718 having solder 719 deposited thereon. Each of the heaters may be powered so as to heat the solder 719 deposited on the under bump metal pads 718 at the same time, or each of the heaters may be powered so as to heat the solder 719 deposited on the under bump metal pads 718 in a sequential manner. For example, to locally heat the first optical component 710, in some implementations a light source (e.g., a laser having a particular wavelength) may be provided or positioned at or near a location of an under bump metal pad 718 having solder 719 deposited thereon and the light source may be implemented (activated) to heat the solder 719. In some implementations, a plurality of light sources may be provided to heat solder deposited on a plurality of under bump metal pads (e.g., at the same time or in a sequential manner). For example, to globally heat the first optical component 710, heat can be applied or directed to the entire first optical component 710 such that the entire first optical component 710 is heated. For example, a heater can be provided or positioned below the first optical component 710 (at a side of the first optical component 710 which is opposite to a side of the first optical component 710 which faces the second optical component 730). For example, a heater can be provided or positioned above the first optical component 710 (at a side of the first optical component 710 which faces the second optical component 730). For example, heaters can be provided or positioned above and below the first optical component 710 (at a side of the first optical component 710 which faces the second optical component 730 and at a side of the first optical component 710 which is opposite to the side which faces the second optical component 730).

For example, heat can be applied to the solder deposited on the third optical component 720 or fourth optical component 760 by locally or globally heating the third optical component 720 or fourth optical component 760. For example, to locally heat the third optical component 720 or fourth optical component 760, heat can be applied or directed to solder deposited on one or more under bump metal pads. In some implementations, separate heaters (e.g., resistive heaters) may be provided or positioned at or near each location of the under bump metal pads 728, 768 having solder 729, 769 deposited thereon. Each of the heaters may be powered so as to heat the solder 729, 769 deposited on the under bump metal pads 728, 768 at the same time, or each of the heaters may be powered so as to heat the solder 729, 769 deposited on the under bump metal pads 728, 768 in a sequential manner. For example, to locally heat the third optical component 720 or fourth optical component 760, in some implementations a light source (e.g., a laser having a particular wavelength) may be provided or positioned at or near a location of an under bump metal pad 728, 768 having solder 729, 769 deposited thereon and the light source may be implemented (activated) to heat the solder 729, 769. In some implementations, a plurality of light sources may be provided to heat solder deposited on a plurality of under bump metal pads (e.g., at the same time or in a sequential manner). For example, to globally heat the third optical component 720 or fourth optical component 760, heat can be applied or directed to the entire third optical component 720 or fourth optical component 760 such that the entire third optical component 720 or fourth optical component 760 is heated. For example, a heater can be provided or positioned below and/or above the third optical component 720 or fourth optical component 760.

Figure 8A:
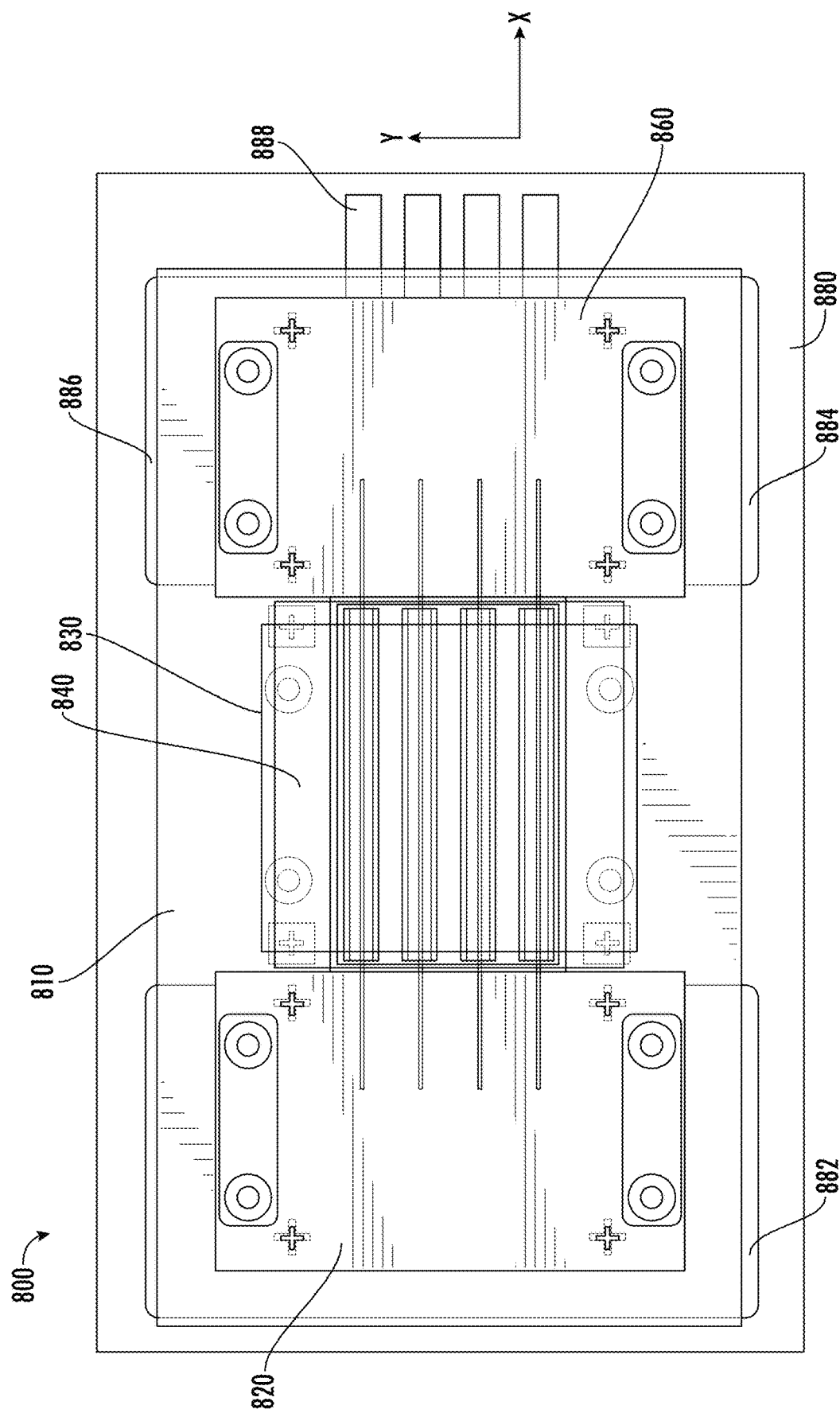
FIGS. 8A-8C are views of an example optical system for a LIDAR system, according to some implementations of the disclosure.
Figure 8B:
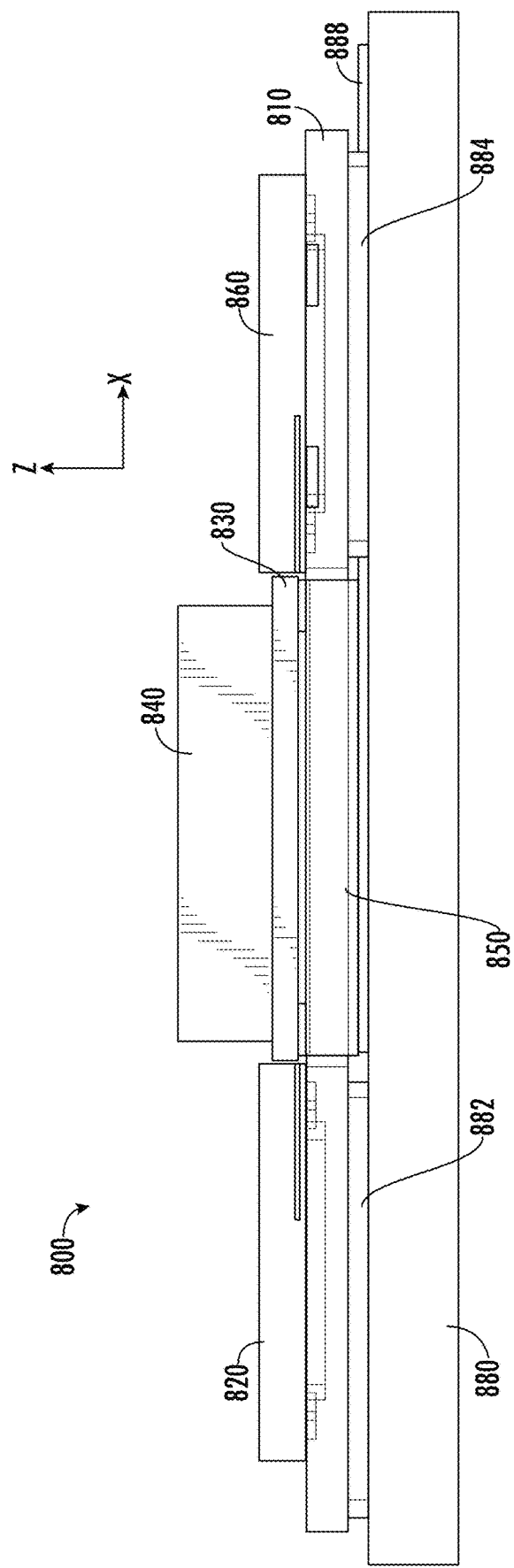
Figure 8C:
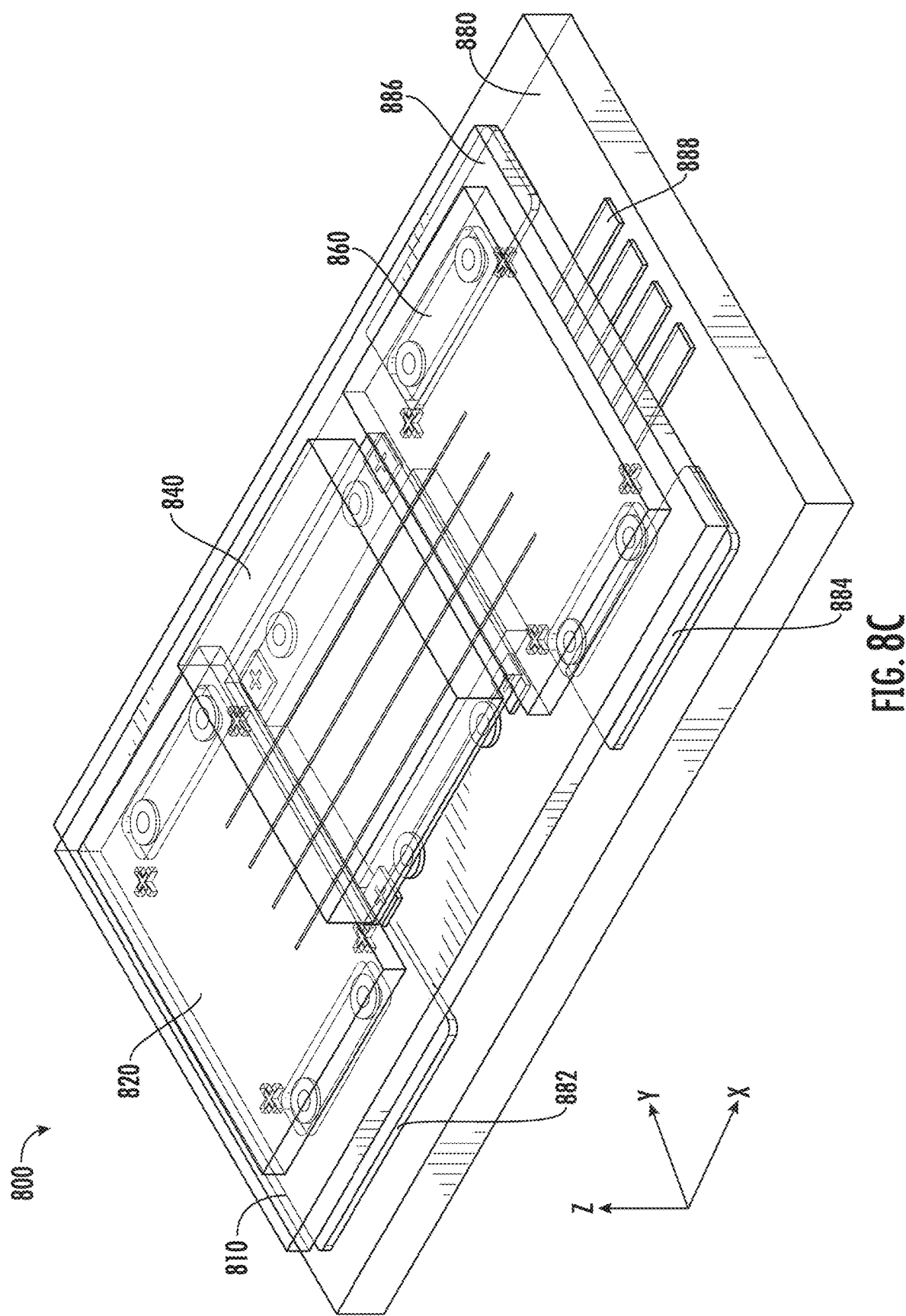

FIGS. 8A-8C depict an example optical system having a plurality of optical components, according to some implementations of the disclosure. The optical system can be included in a LIDAR system, such as the LIDAR system 200 of FIG. 2 and the like.

Referring to the top view of FIG. 8A, side view of FIG. 8B, and perspective view of FIG. 8C, an optical system 800 includes a first optical component 810 which is coupled to a second optical component 830, a third optical component 820, and a fourth optical component 860. The first optical component 810, second optical component 830, third optical component 820, and fourth optical component 860 can correspond to the first optical component 710, second optical component 730, third optical component 720, and fourth optical component 760 of FIGS. 7A-7C, respectively, and therefore a detailed description of the features of each of the first optical component 810, second optical component 830, third optical component 820, and fourth optical component 860 will not be repeated for the sake of brevity. The second optical component 830 is further coupled to a first heat spreader 840 and a second heat spreader 850. The first heat spreader 840 and the second heat spreader 850 can correspond to the first heat spreader 740 and the second heat spreader 750 of FIGS. 7A-7C, and therefore a detailed description of the features of each of the first heat spreader 740 and the second heat spreader 750 will not be repeated for the sake of brevity.

Different from the optical system 700 of FIGS. 7A-7C, the optical system 800 further includes a carrier 880. As illustrated in FIGS. 8A-8C, the carrier 880 (heat sink) can be coupled to the first optical component 810 and the second optical component 830 (e.g., via the second heat spreader 850). For example, the carrier 880 can be coupled to the first optical component 810 and the second optical component 830 via a bonding material (e.g., glue, epoxy, etc.). For example, as shown in FIGS. 8A-8C, the carrier 880 can be coupled to the first optical component 810 via glue 882, 884, 886 at a plurality of different locations. The carrier 880 can further include one or more conductor traces (electrodes) 888 that can be connected to the second side (e.g., a P-side) of the second optical component 830, for example, for supplying power. The P-side of the second optical component 830 may include elements (e.g., dopants) that create holes (positively charged carriers) in the material. In some implementations, the second heat spreader 850 may be coupled to the carrier 880 (e.g., electrically and/or thermally), where the carrier 880 serves as both a heat sink and an electrical terminal for the optical system 800.

Described herein are methods for manufacturing a semiconductor-based LIDAR system for a vehicle, which can ensure that specification requirements are satisfied. As described in more detail herein, the method may be implemented to securely couple a plurality of optical components for an optical system provided.

FIG. 9 is a flow chart of a method 9100 for manufacturing a semiconductor-based LIDAR system for a vehicle, according to some implementations of the disclosure. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring to FIG. 9, at operation 9102, the method 9100 includes coupling a first optical component with solder disposed on a first portion of the first optical component to a second optical component in a first alignment operation, wherein after the first optical component is coupled to the second optical component, the solder disposed on the first portion of the first optical component is not in contact with the second optical component. For example, the first optical component may correspond to a silicon chip, for example a silicon interposer chip. In some implementations, the first optical component can include a through-hole. For example, the first optical component can correspond to any of the first optical components 300, 510, 710, 810. For example, the second optical component may correspond to a semiconductor optical amplifier (SOA) chip. For example, the second optical component can correspond to any of the second optical components 410, 530, 730, 830.

In some implementations, coupling the first optical component to the second optical component in the first alignment operation includes inserting the second optical component in the through-hole (e.g., coupling the first optical component 300 to the second optical component 410 in the first alignment operation includes inserting the second optical component 410 in the through-hole 312). In some implementations, the first alignment operation comprises aligning the first optical component with the second optical component using a first plurality of mechanical stops disposed on the first optical component and a plurality of fiducial marks disposed on the second optical component. For example, the first optical component 300 can be aligned with the second optical component 410 using one or more mechanical stops 302 disposed on the first optical component 300 and one or more fiducial marks 414 disposed on the second optical component 410. In some implementations, a first mechanical stop among the first plurality of mechanical stops may be disposed adjacent to the first portion of the first optical component. For example, a mechanical stop 302 can be disposed adjacent to an under bump metal pad 308.

At operation 9104, the method 9100 includes applying heat to the solder disposed on the first portion of the first optical component to cause the solder disposed on the first portion of the first optical component to flow toward the second optical component and to come into contact with the second optical component.

For example, in a first heating operation, heat can be applied to the solder deposited on the first optical component by locally or globally heating the first optical component. For example, to locally heat the first optical component 300, heat can be applied or directed to solder deposited on one or more under bump metal pads. In some implementations, separate heaters (e.g., resistive heaters) may be provided or positioned at or near each location of the under bump metal pads 308 having solder 310 deposited thereon. Each of the heaters may be powered so as to heat the solder 310 deposited on the under bump metal pads 308 at the same time, or each of the heaters may be powered so as to heat the solder 310 deposited on the under bump metal pads 308 in a sequential manner. For example, to locally heat the first optical component 300, in some implementations a light source (e.g., a laser having a particular wavelength) may be provided or positioned at or near a location of an under bump metal pad 308 having solder 310 deposited thereon and the light source may be implemented (activated) to heat the solder. In some implementations, a plurality of light sources may be provided to heat solder deposited on a plurality of under bump metal pads (e.g., at the same time or in a sequential manner). To globally heat the first optical component 300, heat can be applied or directed to the entire first optical component 300 such that the entire first optical component 300 is heated. For example, a heater can be provided or positioned below the first optical component 300 (at a side of the first optical component 300 which is opposite to a side of the first optical component 300 which faces the second optical component 410). For example, a heater can be provided or positioned above the first optical component 300 (at a side of the first optical component 300 which faces the second optical component 410). For example, heaters can be provided or positioned above and below the first optical component 300 (at a side of the first optical component 300 which faces the second optical component 410 and at a side of the first optical component 300 which is opposite to the side which faces the first optical component 510).

In some implementations, prior to heating the solder at operation 9104, an area or perimeter of the under bump metal pad is smaller than an area or perimeter of the solder before the heat is applied to the solder. For example, as shown in FIG. 3A, the area or perimeter p2 of the under bump metal pad 308 is less than an area or perimeter p1 of the solder 310. For example, the perimeter p1 may correspond to the circumference of the solder 310 when the solder 310 has a circular or substantially circular footprint. For example, as shown in FIG. 3A, the perimeter p2 of the under bump metal pad 308 is less than the perimeter p1 of the solder 310. For example, the diameter of the solder 310 may be more than the diameter of the under bump metal pad 308.

In some implementations, applying the heat to the solder causes the solder to spread on a metal trace disposed on a surface of the second optical component, and to move into a gap between the first optical component and the second optical component via a capillary force. For example, when heat is applied to the solder after the first optical component 300 is coupled to the second optical component 410 in the first alignment operation, the heat can cause the solder to melt and to spread on a metal trace disposed on a surface of the second optical component 410, and to move into a gap between the first optical component 300 and the second optical component 410 via a capillary force.

In some implementations, after heating the solder at operation 9104, an area or perimeter of the under bump metal pad may be equal or substantially equal to an area or perimeter of the solder after the heat is applied to the solder. For example, the perimeter may correspond to a circumference of the solder 310 when the solder 310 has a circular or substantially circular footprint. For example, the diameter of the solder 310 may be equal or substantially equal to the diameter of the under bump metal pad 308.

For example, the height h1 of a mechanical stop 302 can be greater than the height h2 of the solder 310 before the heat is applied to the solder 310 disposed on the first portion of the first optical component 300, and the height h1 of the mechanical stop 302 can be the same or substantially the same as the height h2' of the solder 310 after the heat is applied to the solder 310 disposed on the first portion of the first optical component 300.

At operation 9106, the method 9100 includes coupling the first optical component to a third optical component with solder disposed on a first portion of the third optical component in a second alignment operation, wherein after the first optical component is coupled to the third optical component, the solder disposed on the first portion of the third optical component is not in contact with a second portion of the first optical component. For example, the third optical component may correspond to a silicon chip, for example a silicon chip with a multi-channel waveguide (e.g., a three-channel waveguide, a four-channel waveguide, etc.) or other types of semiconductor optical devices (e.g., a silicon photonics integrated circuit, a silicon photonics integrated circuit, etc.). For example, the third optical component can correspond to any of third optical components 600, 720, 820.

In some implementations, the first portion of the first optical component can correspond to an under bump metal pad (e.g., under bump metal pad 308, 618, 718). In some implementations, the first portion of the third optical component can correspond to an under bump metal pad (e.g., under bump metal pad 608, 728). In some implementations, the first portion of the first optical component is disposed on an outer surface of the first optical component (e.g., the under bump metal pad 308 is disposed on surface 306 of the first optical component 300). In some implementations, the second portion of the first optical component can correspond to an under bump metal pad (e.g., under bump metal pad 316, 616, 716). In some implementations, the second portion of the first optical component can include a recess or recessed portion of the outer surface of the first optical component (e.g., recesses 318, 617, 717).

At operation 9108, the method 9100 includes applying heat to the solder disposed on the first portion of the third optical component to cause the solder disposed on the first portion of the third optical component to flow toward the first optical component and to come into contact with the second portion of the first optical component.

For example, in a second heating operation heat can be applied to the solder deposited on the third optical component by locally or globally heating the second optical component. For example, to locally heat the third optical component 600, heat is applied or directed to solder deposited on one or more under bump metal pads. In some implementations, separate heaters (e.g., resistive heaters) may be provided or positioned at or near each location of the under bump metal pads 608 having solder 610 deposited thereon. Each of the heaters may be powered so as to heat the solder 610 deposited on the under bump metal pads 608 at the same time, or each of the heaters may be powered so as to heat the solder 610 deposited on the under bump metal pads 608 in a sequential manner. For example, to locally heat the third optical component 600, in some implementations a light source (e.g., a laser having a particular wavelength) may be provided or positioned at or near a location of an under bump metal pad 608 having solder 610 deposited thereon and the light source may be implemented (activated) to heat the solder. In some implementations, a plurality of light sources may be provided to heat solder deposited on a plurality of under bump metal pads (e.g., at the same time or in a sequential manner). For example, to globally heat the third optical component 600, heat can be applied or directed to the entire third optical component 600 such that the entire third optical component 600 is heated. For example, a heater can be provided or positioned below the third optical component 600 (at a side of the third optical component 600 which faces the first optical component 300). For example, a heater can be provided or positioned above the third optical component 600 (at a side of the third optical component 600 which faces away from the first optical component 300). For example, heaters can be provided or positioned above and below the third optical component 600 (at a side of the third optical component 600 which faces the first optical component 300 and at a side of the third optical component 600 which is opposite to the side which faces the first optical component 300).

In some implementations, prior to heating the solder at operation 9108, an area or perimeter of the under bump metal pad is smaller than an area or perimeter of the solder before the heat is applied to the solder. For example, as shown in FIG. 6A, the perimeter p4 of the under bump metal pad 608 is less than a perimeter p3 of the solder 610. For example, the perimeter p3 may correspond to a circumference of the solder 610 when the solder 610 has a circular or substantially circular footprint. For example, as shown in FIG. 6A, the perimeter p4 of the under bump metal pad 608 is less than the perimeter p3 of the solder 610. For example, the diameter of the solder 610 may be more than the diameter of the under bump metal pad 608.

In some implementations, applying the heat to the solder causes the solder to spread on a metal trace disposed on a surface of the first optical component, and to move into a gap between the first optical component and the third optical component via a capillary force. For example, when heat is applied to the solder after the first optical component 300 is coupled to the third optical component 600 in the second alignment operation, the heat can cause the solder to melt and to spread on a metal trace disposed on a surface of the first optical component 300, and to move into a gap between the first optical component 300 and the third optical component 600 via a capillary force.

In some implementations, after heating the solder at operation 9108, an area or perimeter of the under bump metal pad 608 may be equal or substantially equal to an area or perimeter of the solder 610 after the heat is applied to the solder 610. For example, the perimeter may correspond to a circumference of the solder 610 when the solder 610 has a circular or substantially circular footprint. For example, the diameter of the solder 610 may be equal or substantially equal to the diameter of the under bump metal pad 608.

For example, the height h3 of the recess 717 can be greater than the height of the solder 729 before the heat is applied to the solder 729 disposed on the first portion of the third optical component 720, and the height h3 of the recess 717 can be the same or substantially the same as the height of the solder 729 after the heat is applied to the solder 729 disposed on the first portion of the third optical component 720.

In some implementations, the method 9100 can include coupling a first heat spreader to a first side of the second optical component (e.g., the semiconductor optical amplifier (SOA) chip). For example, first heat spreader 420 can be coupled to a first side of the second optical component 410 (e.g., the semiconductor optical amplifier chip). In some implementations, the first alignment operation can include a flip chip operation 460 (e.g., using a flip chip bonding machine or flip chip system) which includes flipping the SOA chip having the first heat spreader 420 coupled thereto over, and coupling a second heat spreader 430 to a second side of the SOA chip, and coupling the first optical component 710 (e.g., a silicon interposer chip) to the SOA chip by inserting the SOA chip having the first heat spreader 420 and the second heat spreader 430 coupled thereto, in the through-hole of the first optical component 710. For example, as shown in FIG. 4B, a surface area of a side of the first heat spreader 420 facing the first side of the SOA chip (second optical component 410) is greater than a surface area of a side of the second heat spreader 430 facing the second side of the SOA chip (second optical component 410).

In some implementations, the method 9100 can further include providing a fourth optical component with solder disposed on a first portion of the fourth optical component, coupling the first optical component to the fourth optical component in a third alignment operation, wherein after the first optical component is coupled to the fourth optical component, the solder disposed on the first portion of the fourth optical component is not in contact with (i.e., is spaced apart from) a third portion of the first optical component, and applying heat to the solder disposed on the first portion of the fourth optical component to cause the solder disposed on the first portion of the fourth optical component to flow toward or expand in a direction toward the first optical component and to come into contact with the third portion of the first optical component.

For example, the fourth optical component may correspond to a silicon chip, for example a silicon chip with a multi-channel waveguide (e.g., a three-channel waveguide, a four-channel waveguide, etc.) or other types of semiconductor optical devices (e.g., a silicon photonics integrated circuit, a silicon photonics integrated circuit, etc.). For example, the fourth optical component can correspond to any of the fourth optical components 760, 860.

In some implementations, the first portion of the fourth optical component can correspond to an under bump metal pad (e.g., under bump metal pad 768). In some implementations, the third portion of the first optical component can correspond to an under bump metal pad (e.g., under bump metal pad 316, 616, 716). In some implementations, the third portion of the first optical component can correspond to a recess or recessed portion of the outer surface of the first optical component (e.g., recesses 318, 617, 717).

For example, in a third heating operation heat can be applied to the solder deposited on the fourth optical component by locally or globally heating the fourth optical component, in a manner similar to that described herein for the third optical element.

In some implementations, prior to heating the solder 769, an area or perimeter of the under bump metal pad 768 is smaller than an area or perimeter of the solder 769 before the heat is applied to the solder. For example, the diameter of the solder 769 may be more than the diameter of the under bump metal pad 768. In some implementations, applying the heat to the solder 769 causes the solder 769 to spread on a metal trace disposed on a surface of the first optical component 710, and to move into a gap between the first optical component 710 and the fourth optical component 760 via a capillary force. For example, when heat is applied to the solder 769 after the first optical component 710 is coupled to the fourth optical component 760 in the third alignment operation, the heat can cause the solder 769 to melt and to spread on a metal trace disposed on a surface of the first optical component 710, and to move into a gap between the first optical component 710 and the fourth optical component 760 via a capillary force.

In some implementations, after heating the solder 769, an area or perimeter of the under bump metal pad 768 may be equal or substantially equal to an area or perimeter of the solder 769 after the heat is applied to the solder 769. For example, the perimeter may correspond to a circumference of the solder 769 when the solder 769 has a circular or substantially circular footprint. For example, the diameter of the solder 769 may be equal or substantially equal to the diameter of the under bump metal pad 768. For example, the height h3 of the recess 717 can be greater than the height of the solder 769 before the heat is applied to the solder 769 disposed on the first portion of the fourth optical component 760, and the height h3 of the recess 717 can be the same or substantially the same as the height of the solder 769 after the heat is applied to the solder 769 disposed on the first portion of the fourth optical component 760.

In some implementations, operations 9106 and 9108 may be performed before operations 9102 and 9104. In some implementations, operations 9102 and 9106 may be performed before operations 9104 and 9108. In some implementations, operations 9104 and operation 9108 may be performed at the same time after operations 9102 and 9106 are performed. Other sequences are also possible.

Figure 10:
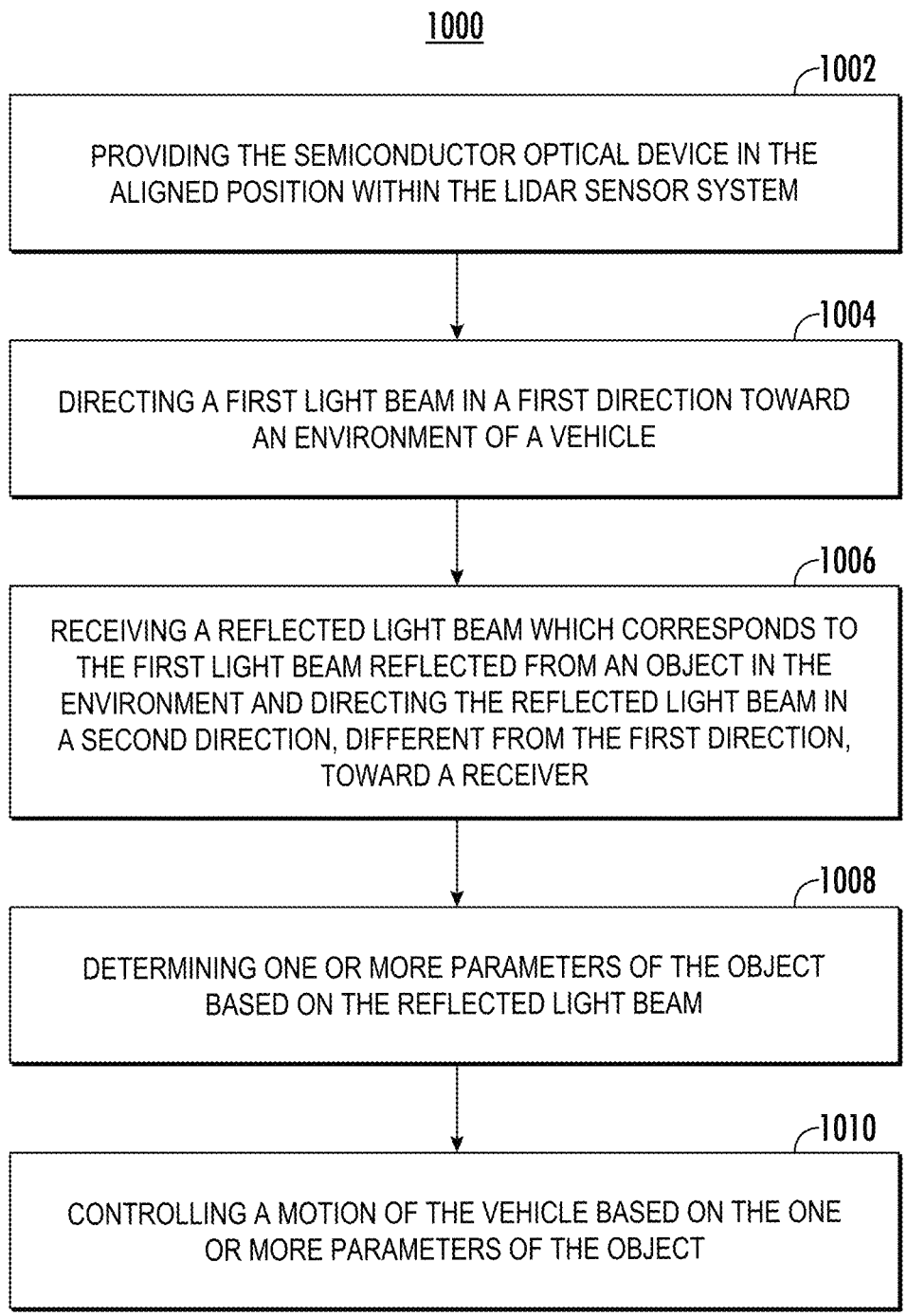

FIG. 10 is a flow diagram of a computer-implemented method 1000 for controlling an autonomous vehicle having a semiconductor-based LIDAR system, according to some implementations of the disclosure. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The method 1000 may be an extension of the method of FIG. 9. However, in some implementations the method 1000 may be a standalone method (e.g., for testing or implementing a semiconductor optical device in a LIDAR system and/or for controlling a vehicle). Referring to FIG. 10, at operation 1002, the method 1000 includes providing the semiconductor optical device in the aligned position as described in reference to previous figures. For example, the semiconductor optical device may be provided in the aligned position after performing the operations of FIG. 9 which can include one or more heating processes (e.g., a local heating process, a global heating process, etc.).

At operation 1004, the method 1000 includes directing a first light beam in a first direction toward an environment of the vehicle. For example, the first light beam may correspond to outgoing light transmitted via the transmitter 220 in FIG. 2 to the object 218.

At operation 1006, the method 1000 includes receiving a reflected light beam which corresponds to the first light beam reflected from the object in the environment toward a receiver (e.g., receiver 222 in FIG. 2). For example, the reflected light beam may correspond to incoming light which has been reflected off object 218 which may be in an environment of the vehicle. Further, the incoming light may be directed toward receiver 222 in FIG. 2.

At operation 1008, the method 1000 includes determining one or more parameters of the object based on the reflected light beam. For example, as described herein, one or more parameters of the object (e.g., object 218) can be determined based on sensor data collected by the LIDAR system. For example, the LIDAR system may output sensor data 104 which can be processed by one or more sub-control system(s) 101 shown in FIG. 1 to determine the parameters of the object. For example, the parameters of the object can include location data associated with the object, distance information associated with the object, identification or classification information associated with the object, motion information associated with the object, etc.

At operation 1010, the method 1000 includes controlling a motion of the vehicle based on the one or more parameters of the object. For example, as described herein, one or more of the sub-control system(s) 101 shown in FIG. 1 can be implemented to control a motion of the vehicle based on the one or more parameters of the object (e.g., by generating a motion plan, by selecting a motion plan, by controlling braking, acceleration, and/or steering components of the vehicle, etc.).

The foregoing describes the technology of this disclosure within the context of a LIDAR system and an autonomous vehicle for example purposes only. As described herein, the technology described herein is not limited to a LIDAR system or an autonomous vehicle and can be implemented for or within other systems, autonomous platforms, and other computing systems.

What is claimed is:

1. A method for manufacturing a semiconductor-based light detection and ranging (LIDAR) system for a vehicle, the method comprising:

coupling a first optical component with solder disposed on a first portion of the first optical component to a second optical component, by inserting the second optical component in a through-hole of the first optical component in a first alignment operation wherein after the first optical component is coupled to the second optical component, the solder disposed on the first portion of the first optical component is not in contact with the second optical component;

applying heat to the solder disposed on the first portion of the first optical component to cause the solder disposed on the first portion of the first optical component to flow toward the second optical component and to come into contact with the second optical component;

coupling the first optical component to a third optical component with solder disposed on a first portion of the third optical component in a second alignment operation, wherein after the first optical component is coupled to the third optical component, the solder disposed on the first portion of the third optical component is not in contact with a second portion of the first optical component; and applying heat to the solder disposed on the first portion of the third optical component to cause the solder disposed on the first portion of the third optical component to flow toward the first optical component and to come into contact with the second portion of the first optical component.

2. The method of claim 1, wherein
the first portion of the first optical component is an under bump metal pad, and
an area of the under bump metal pad is smaller than an area of the solder disposed on the first portion of the first optical component before the heat is applied to the solder disposed on the first portion of the first optical component.

3. The method of claim 2, wherein the area of the under bump metal pad is the same as the area of the solder disposed on the first portion of the first optical component after the heat is applied to the solder disposed on the first portion of the first optical component.

4. The method of claim 1, wherein:
the first portion of the first optical component is disposed on an outer surface of the first optical component, and
the second portion of the first optical component corresponds to a recess of the outer surface of the first optical component.

5. The method of claim 1, wherein the first alignment operation comprises aligning the first optical component with the second optical component using a first plurality of mechanical stops disposed on the first optical component and a plurality of fiducial marks disposed on the second optical component.

6. The method of claim 5, wherein:
a first mechanical stop among the first plurality of mechanical stops is disposed adjacent to the first portion of the first optical component,
a height of the first mechanical stop is greater than a height of the solder disposed on the first portion of the first optical component before the heat is applied to the solder disposed on the first portion of the first optical component, and
the height of the first mechanical stop is the same as the height of the solder disposed on the first portion of the first optical component after the heat is applied to the solder disposed on the first portion of the first optical component.

7. The method of claim 1, wherein:
the first optical component includes a silicon interposer chip having the through-hole,
the second optical component includes a semiconductor optical amplifier chip, and
the third optical component includes a silicon photonics integrated circuit chip.

8. The method of claim 7, further comprising coupling a first heat spreader to a first side of the semiconductor optical amplifier chip, and
wherein the first alignment operation comprises a flip chip operation comprising:
flipping over the semiconductor optical amplifier chip having the first heat spreader coupled thereto, and
coupling a second heat spreader to a second side of the semiconductor optical amplifier chip, and coupling the silicon interposer chip to the semiconductor optical amplifier chip in the first alignment operation by inserting the semiconductor optical amplifier chip having the first heat spreader and the second heat spreader coupled thereto, in the through-hole.

9. The method of claim 8, wherein a surface area of a side of the first heat spreader facing the first side of the semiconductor optical amplifier chip is greater than a surface area of a side of the second heat spreader facing the second side of the semiconductor optical amplifier chip.

10. The method of claim 1, wherein:
applying the heat to the solder disposed on the first portion of the first optical component comprises performing a first heating operation locally heating the first portion of the first optical component, and
applying the heat to the solder disposed on the first portion of the third optical component comprises performing a second heating operation locally heating the first portion of the third optical component.

11. The method of claim 1, wherein applying the heat to the solder disposed on the first portion of the first optical component and applying the heat to the solder disposed on the first portion of the third optical component comprises performing a global heating operation globally heating the first optical component and the third optical component at a same time.

12. The method of claim 1, further comprising:
providing a fourth optical component with solder disposed on a first portion of the fourth optical component;
coupling the first optical component to the fourth optical component in a third alignment operation, wherein after the first optical component is coupled to the fourth optical component, the solder disposed on the first portion of the fourth optical component is not in contact with a third portion of the first optical component; and
applying heat to the solder disposed on the first portion of the fourth optical component to cause the solder disposed on the first portion of the fourth optical component to flow toward the first optical component and to come into contact with the third portion of the first optical component.

13. A light detection and ranging (LIDAR) system, comprising:
an optical system, comprising:
a first optical component, including:
solder disposed on each of one or more first portions of the first optical component,
one or more second portions, and
one or more mechanical stops disposed on each of one or more third portions of the first optical component, and
a second optical component, including:
one or more first portions respectively coupled to the each of the one or more first portions of the first optical component via the solder disposed on the each of the one or more first portions of the first optical component, and
one or more second portions respectively supported by the one or more mechanical stops of the first optical component, and
a third optical component, including:
solder disposed on each of one or more first portions of the third optical component, each of the one or more second portions of the first optical component being respectively coupled to the each of the one or more first portions of the third optical component via the solder disposed on the each of the one or more first portions of the third optical component; and wherein
an area of the solder disposed on at least one of the one or more first portions of the first optical component is the same as an area of a corresponding first portion of the one or more first portions of the first optical component, and
a height of the solder disposed on at least one of the one or more first portions of the first optical component is the same as a height of at least one mechanical stop of the one or more mechanical stops extending in a direction toward the second optical component.

14. The LIDAR system of claim 13, wherein
the one or more first portions are one or more under bump metal pads of the first optical component,
each first portion of the first optical component is disposed on an outer surface of the first optical component, and
each second portion of the first optical component corresponds to a recess of the outer surface of the first optical component.

15. The LIDAR system of claim 13, wherein
the first optical component includes a silicon interposer chip having a through-hole,
the second optical component includes a semiconductor optical amplifier chip, and
the third optical component includes a silicon photonics integrated circuit chip.

16. The LIDAR system of claim 15, further comprising:
a first heat spreader coupled to a first side of the semiconductor optical amplifier chip; and
a second heat spreader coupled to a second side of the semiconductor optical amplifier chip,
wherein the second side of the semiconductor optical amplifier chip faces toward the silicon interposer chip and the first heat spreader is disposed outside of the through-hole.

17. The LIDAR system of claim 13, wherein
the first optical component includes one or more third portions and one or more first waveguides,
the second optical component includes one or more second waveguides aligned with the one or more first waveguides, and
the optical system further comprises:
a fourth optical component, including:
solder disposed on each of one or more first portions of the fourth optical component, each of the one or more third portions of the first optical component being respectively coupled to the each of the one or more first portions of the fourth optical component via the solder disposed on the each of the one or more first portions of the fourth optical component, and
one or more third waveguides aligned with the one or more first waveguides.

18. An autonomous vehicle (AV) control system for a vehicle, comprising:
one or more processors; and
the LIDAR system of claim 13.

19. An autonomous vehicle, comprising:
an autonomous vehicle control system, the autonomous vehicle control system comprising one or more processors and a Light Detection and Ranging (LIDAR) system, the LIDAR system comprising:

a light source configured to emit a beam to be directed toward an object in an environment of the autonomous vehicle; and
an optical system, comprising:
a first optical component, including:
solder disposed on each of one or more first portions of the first optical component,
one or more second portions, and
one or more mechanical stops disposed on each of one or more third portions of the first optical component, and
a second optical component, including:
one or more first portions respectively coupled to the each of the one or more first portions of the first optical component via the solder disposed on the each of the one or more first portions of the first optical component, and
one or more second portions respectively supported by the one or more mechanical stops of the first optical component,
a third optical component, including:
solder disposed on each of one or more first portions of the third optical component, each of the one or more second portions of the first optical component being respectively coupled to the each of the one or more first portions of the third optical component via the solder disposed on the each of the one or more first portions of the third optical component; and
wherein
an area of the solder disposed on at least one of the one or more first portions of the first optical component is the same as an area of a corresponding first portion of the one or more first portions of the first optical component, and
a height of the solder disposed on at least one of the one or more first portions of the first optical component is the same as a height of at least one mechanical stop of the one or more mechanical stops extending in a direction toward the second optical component;
a receiver configured to receive a reflected beam from the object and determine an object detection associated with the object by processing the reflected beam via at least one of the second optical element or the third optical element; and
an autonomous vehicle controller configured to control the autonomous vehicle based on the object detection associated with the object.

20. A method for manufacturing a semiconductor-based light detection and ranging (LIDAR) system for a vehicle, the method comprising:
coupling a first optical component with solder disposed on a first portion disposed on an outer surface of the first optical component to a second optical component in a first alignment operation, wherein after the first optical component is coupled to the second optical component, the solder disposed on the first portion of the first optical component is not in contact with the second optical component;
applying heat to the solder disposed on the first portion of the first optical component to cause the solder disposed on the first portion of the first optical component to flow toward the second optical component and to come into contact with the second optical component;
coupling the first optical component to a third optical component with solder disposed on a first portion of the third optical component in a second alignment operation, wherein after the first optical component is coupled to the third optical component, the solder disposed on the first portion of the third optical component is not in contact with a second portion of the first optical component, the second portion of the first optical component corresponding to a recess of the outer surface of the first optical component; and applying heat to the solder disposed on the first portion of the third optical component to cause the solder disposed on the first portion of the third optical component to flow toward the first optical component and to come into contact with the second portion of the first optical component.

* * * * *